United States Patent
Lyalin et al.

(10) Patent No.: US 11,482,975 B2
(45) Date of Patent: Oct. 25, 2022

(54) POWER AMPLIFIERS WITH ADAPTIVE BIAS FOR ENVELOPE TRACKING APPLICATIONS

(71) Applicant: Skyworks Solutions, Inc., Irvine, CA (US)

(72) Inventors: Aleksey A. Lyalin, Moorpark, CA (US); Huiming Xu, Newbury Park, CA (US); Shayan Farahvash, Kensington, CA (US); Georgios Palaskas, Portland, OR (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 17/302,953

(22) Filed: May 17, 2021

(65) Prior Publication Data

US 2021/0384876 A1    Dec. 9, 2021

Related U.S. Application Data

(60) Provisional application No. 62/704,972, filed on Jun. 5, 2020.

(51) Int. Cl.
*H03F 3/24* (2006.01)
*H03F 1/02* (2006.01)
(Continued)

(52) U.S. Cl.
CPC ........... *H03F 3/245* (2013.01); *H03F 1/0233* (2013.01); *H04B 1/38* (2013.01); *H03F 2200/105* (2013.01); *H03F 2200/451* (2013.01)

(58) Field of Classification Search
None
See application file for complete search history.

(56) References Cited

U.S. PATENT DOCUMENTS

| 5,455,542 A | 10/1995 | Spence et al. |
| 5,459,762 A | 10/1995 | Wang et al. |

(Continued)

FOREIGN PATENT DOCUMENTS

| WO | WO 2018/052539 | 3/2018 |
| WO | WO 2021/061851 | 4/2021 |

OTHER PUBLICATIONS

Balteanu, Florinel "RF Front End Module Architectures for 5G," dated Nov. 2019, in 8 pages.

*Primary Examiner* — Pablo N Tran
(74) *Attorney, Agent, or Firm* — Knobbe, Martens, Olson & Bear, LLP

(57) ABSTRACT

Power amplifiers with adaptive bias for envelope tracking applications are provided herein. In certain embodiments, an envelope tracking system includes a power amplifier that amplifies a radio frequency (RF) signal and that receives power from a power amplifier supply voltage, and an envelope tracker that generates the power amplifier supply voltage based on an envelope of the RF signal. The power amplifier includes a field-effect transistor (FET) for amplifying the RF signal, and a current mirror including an input that receives a reference current and an output connected to the power amplifier supply voltage. An internal voltage of the current mirror is used to bias the gate of the FET to compensate the FET for changes in the power amplifier supply voltage arising from envelope tracking.

20 Claims, 12 Drawing Sheets

(51) Int. Cl.
*H04B 1/38* (2015.01)
*H03F 1/56* (2006.01)

(56) References Cited

U.S. PATENT DOCUMENTS

| | | | |
|---|---|---|---|
| 5,724,657 A | 3/1998 | Lin et al. | |
| 5,761,250 A | 6/1998 | Lin | |
| 6,204,734 B1 | 3/2001 | Zhang et al. | |
| 6,438,365 B1 | 8/2002 | Balteanu | |
| 6,639,470 B1 | 10/2003 | Andrys et al. | |
| 6,671,500 B2 | 12/2003 | Damgaard et al. | |
| 6,704,560 B1 | 3/2004 | Balteanu et al. | |
| 6,734,729 B1 | 5/2004 | Andrys et al. | |
| 6,768,382 B1 | 7/2004 | Shie et al. | |
| 6,842,067 B2 | 1/2005 | Andrys et al. | |
| 6,977,976 B1 | 12/2005 | Birkett et al. | |
| 7,136,003 B1 | 11/2006 | Ripley et al. | |
| 7,142,053 B2 | 11/2006 | Phillips et al. | |
| 7,193,474 B2 | 3/2007 | Phillips et al. | |
| 7,276,973 B2 | 10/2007 | Ripley et al. | |
| 7,288,991 B2 | 10/2007 | Ripley | |
| 7,385,442 B1 | 6/2008 | Ripley | |
| 7,397,089 B2 | 7/2008 | Zhang et al. | |
| 7,408,413 B2 | 8/2008 | Ripley | |
| 7,414,479 B2 | 8/2008 | Ripley et al. | |
| 7,443,246 B2 | 10/2008 | Andrys et al. | |
| 7,482,868 B2 | 1/2009 | Hageman et al. | |
| 7,496,339 B2 | 2/2009 | Balteanu et al. | |
| 7,538,606 B2 | 5/2009 | Ripley | |
| 7,589,592 B2 | 9/2009 | Fisher et al. | |
| 7,605,651 B2 | 10/2009 | Ripley et al. | |
| 7,696,826 B2 | 4/2010 | Ripley et al. | |
| 7,876,160 B2 | 1/2011 | Zhang et al. | |
| 7,994,861 B2 | 8/2011 | Fisher et al. | |
| 8,023,909 B2 | 9/2011 | Ripley et al. | |
| 8,049,565 B2 | 11/2011 | Zhang et al. | |
| 8,140,028 B2 | 3/2012 | Balteanu et al. | |
| 8,154,345 B2 | 4/2012 | Andrys et al. | |
| 8,188,793 B2 | 5/2012 | Ripley et al. | |
| 8,330,546 B2 | 12/2012 | Ripley et al. | |
| 8,351,873 B2 | 1/2013 | Balteanu et al. | |
| 8,362,840 B2 | 1/2013 | Andrys et al. | |
| 8,421,539 B2 | 4/2013 | Zhang et al. | |
| 8,514,016 B2 | 8/2013 | Ripley et al. | |
| 8,526,995 B2 | 9/2013 | Ripley et al. | |
| 8,537,579 B2 | 9/2013 | Ripley et al. | |
| 8,598,953 B2 | 12/2013 | Fisher et al. | |
| 8,611,836 B2 | 12/2013 | Ripley et al. | |
| 8,634,789 B2 | 1/2014 | Chang et al. | |
| 8,644,777 B2 | 2/2014 | Ripley et al. | |
| 8,666,337 B2 | 3/2014 | Ripley et al. | |
| 8,717,100 B2 | 5/2014 | Reisner et al. | |
| 8,718,188 B2 | 5/2014 | Balteanu et al. | |
| 8,719,459 B2 | 5/2014 | Ripley | |
| 8,774,739 B2 | 7/2014 | Ripley et al. | |
| 8,786,371 B2 | 7/2014 | Popplewell et al. | |
| 8,791,719 B2 | 7/2014 | Ripley | |
| 8,824,991 B2 | 9/2014 | Chang et al. | |
| 8,928,426 B2 | 1/2015 | Li et al. | |
| 8,928,427 B2 | 1/2015 | Li et al. | |
| 8,941,449 B2 | 1/2015 | Li et al. | |
| 8,948,712 B2 | 2/2015 | Chen et al. | |
| 8,981,847 B2 | 3/2015 | Balteanu | |
| 8,983,406 B2 | 3/2015 | Zhang et al. | |
| 8,989,682 B2 | 3/2015 | Ripley et al. | |
| 9,030,259 B2 | 5/2015 | Fisher et al. | |
| 9,041,472 B2 | 5/2015 | Chen et al. | |
| 9,042,854 B2 | 5/2015 | Wang et al. | |
| 9,054,575 B2 | 6/2015 | Ripley et al. | |
| 9,054,663 B2 | 6/2015 | Reisner et al. | |
| 9,071,335 B2 | 6/2015 | Agarwal et al. | |
| 9,083,282 B2 | 7/2015 | Zhang et al. | |
| 9,083,455 B2 | 7/2015 | Popplewell et al. | |
| 9,092,393 B2 | 7/2015 | Whitefield et al. | |
| 9,106,183 B2 | 8/2015 | Liu et al. | |
| 9,116,183 B2 | 8/2015 | Cummins et al. | |
| 9,118,277 B2 | 8/2015 | Balteanu et al. | |
| 9,136,795 B2 | 9/2015 | Liu et al. | |
| 9,143,096 B2 | 9/2015 | Balteanu et al. | |
| 9,189,430 B2 | 11/2015 | Ross et al. | |
| 9,197,128 B2 | 11/2015 | Popplewell et al. | |
| 9,202,747 B2 | 12/2015 | Chen et al. | |
| 9,203,529 B2 | 12/2015 | Chen et al. | |
| 9,214,387 B2 | 12/2015 | Chen et al. | |
| 9,214,979 B2 | 12/2015 | Ripley | |
| 9,225,298 B2 | 12/2015 | Ripley et al. | |
| 9,231,528 B2 * | 1/2016 | Granger-Jones | H03F 1/302 |
| 9,231,533 B2 | 1/2016 | Zhang et al. | |
| 9,288,098 B2 | 3/2016 | Yan et al. | |
| 9,294,043 B2 | 3/2016 | Ripley et al. | |
| 9,294,054 B2 | 3/2016 | Balteanu et al. | |
| 9,295,157 B2 | 3/2016 | Chen et al. | |
| 9,305,859 B2 | 4/2016 | Williams et al. | |
| 9,374,045 B2 | 6/2016 | Zhang et al. | |
| 9,391,648 B2 | 7/2016 | Popplewell et al. | |
| 9,418,950 B2 | 8/2016 | Zhang et al. | |
| 9,419,567 B2 | 8/2016 | Ripley et al. | |
| 9,425,833 B2 | 8/2016 | Popplewell et al. | |
| 9,445,371 B2 | 9/2016 | Khesbak et al. | |
| 9,450,639 B2 | 9/2016 | Zhang et al. | |
| 9,451,566 B1 | 9/2016 | Morshedi et al. | |
| 9,455,669 B2 | 9/2016 | Modi et al. | |
| 9,467,940 B2 | 10/2016 | Zhang et al. | |
| 9,473,019 B2 | 10/2016 | Ripley et al. | |
| 9,473,073 B2 | 10/2016 | Liu et al. | |
| 9,490,827 B2 | 11/2016 | Wang et al. | |
| 9,503,025 B2 | 11/2016 | Cao et al. | |
| 9,506,968 B2 | 11/2016 | Hoang et al. | |
| 9,515,029 B2 | 12/2016 | Chen et al. | |
| 9,520,835 B2 | 12/2016 | Ko et al. | |
| 9,543,919 B2 | 1/2017 | Ripley | |
| 9,571,049 B2 | 2/2017 | Zhang et al. | |
| 9,571,152 B2 | 2/2017 | Ripley et al. | |
| 9,584,070 B2 | 2/2017 | Balteanu et al. | |
| 9,588,529 B2 | 3/2017 | Balteanu et al. | |
| 9,602,060 B2 | 3/2017 | Gorbachov et al. | |
| 9,602,064 B2 | 3/2017 | Wu et al. | |
| 9,606,947 B2 | 3/2017 | Ross et al. | |
| 9,621,034 B2 | 4/2017 | Liu et al. | |
| 9,621,118 B2 | 4/2017 | Ripley et al. | |
| 9,646,936 B2 | 5/2017 | Chen et al. | |
| 9,660,584 B2 | 5/2017 | Modi et al. | |
| 9,667,200 B2 | 5/2017 | Ripley | |
| 9,668,215 B2 | 5/2017 | Balteanu et al. | |
| 9,673,707 B2 | 6/2017 | Popplewell et al. | |
| 9,678,528 B2 | 6/2017 | Ripley | |
| 9,679,869 B2 | 6/2017 | Petty-weeks et al. | |
| 9,692,357 B2 | 6/2017 | Hoang et al. | |
| 9,698,736 B2 | 7/2017 | Ripley | |
| 9,698,740 B2 | 7/2017 | Lin et al. | |
| 9,698,832 B2 | 7/2017 | Popplewell et al. | |
| 9,698,853 B2 | 7/2017 | Andrys et al. | |
| 9,703,913 B2 | 7/2017 | Chen et al. | |
| 9,712,125 B2 | 7/2017 | Lehtola et al. | |
| 9,712,196 B2 | 7/2017 | Ripley et al. | |
| 9,712,197 B2 | 7/2017 | Ripley et al. | |
| 9,722,547 B2 | 8/2017 | Ripley et al. | |
| 9,735,737 B2 | 8/2017 | Gorbachov et al. | |
| 9,748,985 B2 | 8/2017 | Zhang et al. | |
| 9,768,740 B2 | 9/2017 | Zhang et al. | |
| 9,774,300 B2 | 9/2017 | Jin et al. | |
| 9,780,741 B2 | 10/2017 | Ripley et al. | |
| 9,806,395 B2 | 10/2017 | Li et al. | |
| 9,806,676 B2 | 10/2017 | Balteanu et al. | |
| 9,806,679 B2 | 10/2017 | Gorbachov et al. | |
| 9,831,765 B2 | 11/2017 | Liu et al. | |
| 9,831,834 B2 | 11/2017 | Balteanu et al. | |
| 9,831,841 B2 | 11/2017 | Wu et al. | |
| 9,837,965 B1 * | 12/2017 | Wagh | H03F 1/56 |
| 9,838,058 B2 | 12/2017 | Pehlke et al. | |
| 9,843,293 B1 * | 12/2017 | Wagh | H03F 1/223 |
| 9,847,755 B2 | 12/2017 | Sun et al. | |
| 9,853,620 B2 | 12/2017 | Gorbachov et al. | |
| 9,871,599 B2 | 1/2018 | Chen et al. | |

(56) References Cited

U.S. PATENT DOCUMENTS

| | | |
|---|---|---|
| 9,876,471 B2 | 1/2018 | Modi et al. |
| 9,876,473 B2 | 1/2018 | Khesbak et al. |
| 9,887,668 B2 | 2/2018 | Zampardi, Jr. et al. |
| 9,893,682 B2 | 2/2018 | Zhu et al. |
| 9,893,686 B2 | 2/2018 | Ripley |
| 9,899,961 B2 | 2/2018 | Lehtola et al. |
| 9,905,902 B2 | 2/2018 | Zhang et al. |
| 9,912,233 B2 | 3/2018 | Liu et al. |
| 9,929,694 B2 | 3/2018 | Ripley |
| 9,935,582 B2 | 4/2018 | Balteanu et al. |
| 9,935,677 B2 | 4/2018 | Puente et al. |
| 9,948,241 B2 | 4/2018 | Popplewell et al. |
| 9,966,982 B2 | 5/2018 | Ripley et al. |
| 9,971,377 B2 | 5/2018 | Balteanu et al. |
| 9,973,088 B2 | 5/2018 | Balteanu et al. |
| 9,985,592 B2 | 5/2018 | Gorbachov et al. |
| 9,990,322 B2 | 6/2018 | Whitefield et al. |
| 9,991,856 B2 | 6/2018 | Khesbak et al. |
| 10,033,277 B2 | 7/2018 | Ripley et al. |
| 10,033,385 B2 | 7/2018 | Ripley |
| 10,038,406 B2 | 7/2018 | Liu et al. |
| 10,041,987 B2 | 8/2018 | Hoang et al. |
| 10,044,400 B2 | 8/2018 | Zhang et al. |
| 10,050,529 B2 | 8/2018 | Pehlke et al. |
| 10,061,885 B2 | 8/2018 | Chen et al. |
| 10,063,200 B2 | 8/2018 | Wu et al. |
| 10,080,192 B2 | 9/2018 | Balteanu et al. |
| 10,090,811 B2 | 10/2018 | Ripley et al. |
| 10,090,812 B2 | 10/2018 | Modi et al. |
| 10,097,216 B2 | 10/2018 | Gorbachov et al. |
| 10,103,726 B2 | 10/2018 | Wilz et al. |
| 10,116,274 B2 | 10/2018 | Ripley et al. |
| 10,135,408 B2 | 11/2018 | Cao et al. |
| 10,141,901 B2 | 11/2018 | Zhang et al. |
| 10,147,994 B2 | 12/2018 | Jayaraman et al. |
| 10,181,820 B2 | 1/2019 | Balteanu et al. |
| 11,082,021 B2 | 8/2021 | Lin et al. |
| 11,239,800 B2 | 2/2022 | Drogi et al. |
| 2007/0268074 A1 | 11/2007 | Vejzovic |
| 2008/0051042 A1 | 2/2008 | Komaili et al. |
| 2008/0101263 A1 | 5/2008 | Barber et al. |
| 2009/0040671 A1 | 2/2009 | Zhang |
| 2009/0206932 A1 | 8/2009 | Wu |
| 2010/0197365 A1 | 8/2010 | Ripley et al. |
| 2011/0025422 A1* | 2/2011 | Marra .................. H03F 3/04 330/296 |
| 2011/0043284 A1* | 2/2011 | Zhao .................. H03F 1/0283 330/277 |
| 2011/0128761 A1 | 6/2011 | Ripley et al. |
| 2012/0019335 A1 | 1/2012 | Hoang et al. |
| 2012/0119840 A1 | 5/2012 | Sanduleanu et al. |
| 2012/0154036 A1 | 6/2012 | Oh et al. |
| 2012/0200354 A1 | 8/2012 | Ripley et al. |
| 2012/0269240 A1 | 10/2012 | Balteanu et al. |
| 2013/0285750 A1 | 10/2013 | Chowdhury et al. |
| 2013/0310114 A1* | 11/2013 | Zohny .................. H03F 3/193 330/296 |
| 2014/0184334 A1 | 7/2014 | Nobbe et al. |
| 2014/0266448 A1 | 9/2014 | Cha et al. |
| 2014/0327483 A1 | 11/2014 | Balteanu |
| 2015/0061770 A1* | 3/2015 | Luo .................. H03F 3/193 330/288 |
| 2015/0145596 A1 | 5/2015 | Fagg |
| 2015/0145604 A1 | 5/2015 | Scott et al. |
| 2015/0171796 A1 | 6/2015 | Matsui |
| 2015/0236651 A1 | 8/2015 | Yang et al. |
| 2015/0236652 A1 | 8/2015 | Yang et al. |
| 2015/0270806 A1 | 9/2015 | Wagh et al. |
| 2015/0280655 A1* | 10/2015 | Nobbe .................. H03F 3/193 330/296 |
| 2015/0365052 A1 | 12/2015 | Barton et al. |
| 2016/0014935 A1 | 1/2016 | Agarwal et al. |
| 2016/0027571 A1 | 1/2016 | Zhang et al. |
| 2016/0094254 A1 | 3/2016 | Ripley |
| 2016/0163661 A1 | 6/2016 | Chen et al. |
| 2016/0241210 A1 | 8/2016 | Andrys et al. |
| 2016/0241292 A1 | 8/2016 | Ripley |
| 2016/0241299 A1 | 8/2016 | Ripley |
| 2016/0242057 A1 | 8/2016 | Ripley et al. |
| 2016/0248381 A1 | 8/2016 | Yang |
| 2016/0294328 A1 | 10/2016 | Kondo et al. |
| 2016/0329866 A1 | 11/2016 | Gorbachov et al. |
| 2017/0005629 A1 | 1/2017 | Yang et al. |
| 2017/0040955 A1 | 2/2017 | Yang et al. |
| 2017/0085223 A1 | 3/2017 | Miol et al. |
| 2017/0093505 A1 | 3/2017 | Ripley et al. |
| 2017/0094607 A1 | 3/2017 | Ripley |
| 2017/0099059 A1 | 4/2017 | Wang et al. |
| 2017/0126185 A1 | 5/2017 | Kang et al. |
| 2017/0131734 A1 | 5/2017 | Balteanu et al. |
| 2017/0149437 A1* | 5/2017 | Luo .................. H03L 7/093 |
| 2017/0160318 A1 | 6/2017 | Zhang et al. |
| 2017/0162705 A1 | 6/2017 | Gorbachov et al. |
| 2017/0163218 A1 | 6/2017 | Gorbachov et al. |
| 2017/0163226 A1 | 6/2017 | Gorbachov et al. |
| 2017/0195972 A1 | 7/2017 | Drogi et al. |
| 2017/0223632 A1 | 8/2017 | Balteanu et al. |
| 2017/0228332 A1 | 8/2017 | Ross et al. |
| 2017/0264253 A1 | 9/2017 | Gorbachov et al. |
| 2017/0271301 A1 | 9/2017 | Petty-weeks et al. |
| 2017/0271302 A1 | 9/2017 | Petty-weeks et al. |
| 2017/0271303 A1 | 9/2017 | Petty-weeks et al. |
| 2017/0277216 A1 | 9/2017 | Ripley |
| 2017/0279350 A1 | 9/2017 | Liu et al. |
| 2017/0294885 A1 | 10/2017 | Kang et al. |
| 2017/0301647 A1 | 10/2017 | Petty-weeks et al. |
| 2017/0302231 A1 | 10/2017 | Ripley et al. |
| 2017/0317648 A1 | 11/2017 | Gorbachov et al. |
| 2017/0317653 A1 | 11/2017 | Lehtola et al. |
| 2017/0324432 A1 | 11/2017 | Zhang et al. |
| 2017/0338773 A1 | 11/2017 | Balteanu et al. |
| 2017/0346516 A1 | 11/2017 | Ripley et al. |
| 2018/0076772 A1 | 3/2018 | Khesbak et al. |
| 2018/0083578 A1* | 3/2018 | Klaren .................. H03F 1/223 |
| 2018/0097482 A1 | 4/2018 | Gorbachov et al. |
| 2018/0102753 A1 | 4/2018 | Gorbachov et al. |
| 2018/0123528 A1 | 5/2018 | Jo et al. |
| 2018/0123529 A1 | 5/2018 | Jo et al. |
| 2018/0138574 A1 | 5/2018 | Li et al. |
| 2018/0138862 A1 | 5/2018 | Balteanu et al. |
| 2018/0152945 A1 | 5/2018 | Balteanu |
| 2018/0159476 A1 | 6/2018 | Balteanu et al. |
| 2018/0159478 A1 | 6/2018 | Balteanu et al. |
| 2018/0159577 A1 | 6/2018 | Pehlke et al. |
| 2018/0167037 A1 | 6/2018 | Zhu et al. |
| 2018/0175814 A1 | 6/2018 | Wu et al. |
| 2018/0183389 A1 | 6/2018 | Lehtola et al. |
| 2018/0191050 A1 | 7/2018 | Zhang et al. |
| 2018/0234095 A1 | 8/2018 | Balteanu et al. |
| 2018/0262170 A1 | 9/2018 | Gorbachov et al. |
| 2018/0269838 A1 | 9/2018 | Ripley |
| 2018/0278214 A1 | 9/2018 | Jin et al. |
| 2018/0287573 A1 | 10/2018 | Khesbak et al. |
| 2018/0294776 A1 | 10/2018 | Popplewell et al. |
| 2018/0302036 A1 | 10/2018 | Balteanu et al. |
| 2018/0331659 A1 | 11/2018 | Khesbak et al. |
| 2018/0343029 A1 | 11/2018 | Zhang et al. |
| 2018/0351454 A1 | 12/2018 | Khesbak et al. |
| 2018/0351457 A1 | 12/2018 | Ripley |
| 2018/0365365 A1 | 12/2018 | Chen et al. |
| 2018/0375476 A1 | 12/2018 | Balteanu et al. |
| 2018/0375483 A1 | 12/2018 | Balteanu et al. |
| 2019/0020315 A1 | 1/2019 | Khesbak et al. |
| 2019/0028136 A1 | 1/2019 | Zhang et al. |
| 2019/0036524 A1 | 1/2019 | Wilz et al. |
| 2019/0041442 A1 | 2/2019 | Hoang et al. |
| 2019/0044554 A1 | 2/2019 | Gorbachov et al. |
| 2019/0074813 A1 | 3/2019 | Zou et al. |
| 2019/0123690 A1 | 4/2019 | Balteanu et al. |
| 2019/0131684 A1 | 5/2019 | Jayaraman et al. |
| 2019/0158045 A1 | 5/2019 | Zampardi, Jr. et al. |
| 2019/0158046 A1 | 5/2019 | Lehtola et al. |
| 2019/0165736 A1 | 5/2019 | Khesbak et al. |

(56) References Cited

U.S. PATENT DOCUMENTS

| | | |
|---|---|---|
| 2019/0171785 A1 | 6/2019 | Chen et al. |
| 2019/0173432 A1 | 6/2019 | Van Der Heijden et al. |
| 2019/0181816 A1 | 6/2019 | Ishihara et al. |
| 2019/0190462 A1 | 6/2019 | Zhu et al. |
| 2019/0199434 A1 | 6/2019 | Ripley |
| 2019/0214902 A1 | 7/2019 | Liu et al. |
| 2019/0215774 A1 | 7/2019 | Ripley |
| 2019/0229621 A1 | 7/2019 | Balteanu et al. |
| 2019/0229679 A1 | 7/2019 | Gorbachov et al. |
| 2019/0229682 A1 | 7/2019 | Gorbachov et al. |
| 2019/0245439 A1 | 8/2019 | Pehlke et al. |
| 2019/0273473 A1 | 9/2019 | Gorbachov et al. |
| 2019/0273478 A1 | 9/2019 | Lin et al. |
| 2019/0273480 A1 | 9/2019 | Lin et al. |
| 2019/0288671 A1 | 9/2019 | Ripley et al. |
| 2019/0312328 A1 | 10/2019 | Zhang et al. |
| 2019/0319583 A1 | 10/2019 | El-Hassan et al. |
| 2019/0319720 A1 | 10/2019 | Ripley et al. |
| 2019/0331716 A1 | 10/2019 | Zhang et al. |
| 2019/0334564 A1 | 10/2019 | Gorbachov et al. |
| 2019/0341888 A1 | 11/2019 | Drogi et al. |
| 2019/0372526 A1 | 12/2019 | Balteanu et al. |
| 2019/0372628 A1 | 12/2019 | Balteanu et al. |
| 2019/0379332 A1 | 12/2019 | Ripley |
| 2019/0385781 A1 | 12/2019 | Zhang et al. |
| 2019/0386617 A1 | 12/2019 | Naraine et al. |
| 2019/0386698 A1 | 12/2019 | Miol et al. |
| 2020/0007088 A1 | 1/2020 | Ranta et al. |
| 2020/0007177 A1 | 1/2020 | Ripley et al. |
| 2020/0052660 A1 | 2/2020 | Cao et al. |
| 2020/0067406 A1 | 2/2020 | Khesbak et al. |
| 2020/0076393 A1 | 3/2020 | Gorbachov et al. |
| 2020/0083915 A1 | 3/2020 | Zhang et al. |
| 2020/0091820 A1 | 3/2020 | Ripley |
| 2020/0091870 A1 | 3/2020 | Lehtola et al. |
| 2020/0091878 A1 | 3/2020 | Maxim et al. |
| 2020/0099343 A1 | 3/2020 | Khesbak et al. |
| 2020/0103448 A1 | 4/2020 | Hoang et al. |
| 2020/0106399 A1 | 4/2020 | Ripley et al. |
| 2020/0112300 A1 | 4/2020 | Balteanu et al. |
| 2020/0127619 A1 | 4/2020 | Khesbak et al. |
| 2020/0136670 A1 | 4/2020 | Zhang et al. |
| 2020/0154434 A1 | 5/2020 | Balteanu |
| 2020/0159275 A1 | 5/2020 | Ripley |
| 2020/0162028 A1 | 5/2020 | Balteanu et al. |
| 2020/0162030 A1 | 5/2020 | Drogi et al. |
| 2020/0162032 A1 | 5/2020 | Ripley et al. |
| 2020/0162039 A1 | 5/2020 | Lehtola et al. |
| 2020/0195202 A1 | 6/2020 | Gorbachov et al. |
| 2020/0195207 A1 | 6/2020 | Ripley |
| 2020/0259458 A1 | 8/2020 | Balteanu et al. |
| 2020/0259459 A1 | 8/2020 | Balteanu et al. |
| 2020/0321923 A1 | 10/2020 | Park et al. |
| 2020/0335844 A1 | 10/2020 | Jayaraman et al. |
| 2020/0336110 A1 | 10/2020 | Drogi et al. |
| 2020/0336122 A1 | 10/2020 | Lin et al. |
| 2020/0343865 A1 | 10/2020 | Balteanu et al. |
| 2021/0028872 A1 | 1/2021 | Cho et al. |
| 2021/0099133 A1 | 4/2021 | Drogi et al. |
| 2021/0099136 A1 | 4/2021 | Drogi et al. |
| 2021/0119582 A1 | 4/2021 | Cappello et al. |
| 2021/0384875 A1 | 12/2021 | Lyalin et al. |
| 2021/0384880 A1 | 12/2021 | Lin et al. |

* cited by examiner

POWER AMPLIFIERS WITH ADAPTIVE BIAS FOR ENVELOPE TRACKING APPLICATIONS

CROSS-REFERENCE TO RELATED APPLICATIONS

This application claims the benefit of priority under 35 U.S.C. § 119 of U.S. Provisional Patent Application No. 62/704,972, filed Jun. 5, 2020 and titled "POWER AMPLIFIERS WITH ADAPTIVE BIAS FOR ENVELOPE TRACKING APPLICATIONS," which is herein incorporated by reference in its entirety.

BACKGROUND

Field

Embodiments of the invention relate to electronic systems, and in particular, to power amplifiers for use in radio frequency (RF) electronics.

Description of the Related Technology

Power amplifiers are used in radio frequency (RF) communication systems to amplify RF signals for transmission via antennas. It is important to manage the power of RF signal transmissions to prolong battery life and/or provide a suitable transmit power level.

Examples of RF communication systems with one or more power amplifiers include, but are not limited to, mobile phones, tablets, base stations, network access points, customer-premises equipment (CPE), laptops, and wearable electronics. For example, in wireless devices that communicate using a cellular standard, a wireless local area network (WLAN) standard, and/or any other suitable communication standard, a power amplifier can be used for RF signal amplification. An RF signal can have a frequency in the range of about 30 kHz to 300 GHz, for instance, in the range of about 410 MHz to about 7.125 GHz for Fifth Generation (5G) cellular communications in Frequency Range 1 (FR1) or in the range of about 24.250 GHz to about 52.600 GHz for Frequency Range 2 (FR2) of the 5G communication standard.

SUMMARY

In certain embodiments, the present disclosure relates to a mobile device. The mobile device includes a transceiver configured to generate a radio frequency signal, a power management system including an envelope tracker configured to generate a power amplifier supply voltage that changes in relation to an envelope of the radio frequency signal, and a front end system including a power amplifier configured to amplify the radio frequency signal and to receive power from the power amplifier supply voltage. The power amplifier includes a current mirror having an input configured to receive a reference current and an output electrically connected to the power amplifier supply voltage, and a field-effect transistor configured to amplify the radio frequency signal and having a gate biased based on an internal voltage of the current mirror.

In various embodiments, the internal voltage of the current mirror increases in response to a decrease of the power amplifier supply voltage, and decreases in response to an increase of the power amplifier supply voltage.

In a number of embodiments, the field-effect transistor is a short channel metal oxide semiconductor transistor.

In several embodiments, the power amplifier further includes a choke inductor electrically connected between the power amplifier supply voltage and a drain of the field-effect transistor.

In some embodiments, the current mirror is a Wilson current mirror.

In various embodiments, the power amplifier further includes a buffer configured to buffer the internal voltage of the current mirror to generate a gate bias voltage of the field-effect transistor. According to a number of embodiments, the buffer includes a first depletion-mode transistor and a second depletion-mode transistor configured to provide buffering with a zero shift.

In several embodiments, the current mirror includes a first mirror transistor having a drain configured to output the internal voltage, a second mirror transistor, a third mirror transistor, and a fourth mirror transistor, the third mirror transistor and the first mirror transistor connected in series between the input of the current mirror and a ground voltage, and the fourth mirror transistor and the second mirror transistor connected in series between the output of the current mirror and the ground voltage. According to a number of embodiments, a gate of the first mirror transistor is connected to a gate of the second mirror transistor, and a gate of the third mirror transistor is connected to a gate of the fourth mirror transistor. In accordance with various embodiments, a drain of the second mirror transistor is connected to the gate of the second mirror transistor, and a drain of the third mirror transistor is connected to the gate of the third mirror transistor.

In several embodiments, the power amplifier further includes a current source configured to generate the reference current.

In some embodiments, the envelope tracker includes a DC-to-DC converter configured to output a plurality of regulated voltages, a modulator configured to generate a modulator output voltage at an output based on the plurality of regulated voltages and the envelope of the radio frequency signal, and a modulator output filter coupled between the output of the modulator and the power amplifier supply voltage.

In various embodiments, the envelope tracker includes a DC-to-DC converter and an error amplifier configured to operate in parallel with one another to generate the power amplifier supply voltage.

In certain embodiments, the present disclosure relates to an envelope tracking system. The envelope tracking system includes an envelope tracker configured to generate a power amplifier supply voltage that changes in relation to an envelope of a radio frequency signal, and a power amplifier configured to amplify the radio frequency signal and to receive power from the power amplifier supply voltage. The power amplifier includes a current mirror having an input configured to receive a reference current and an output electrically connected to the power amplifier supply voltage, and a field-effect transistor configured to amplify the radio frequency signal and having a gate biased based on an internal voltage of the current mirror.

In various embodiments, the internal voltage of the current mirror increases in response to a decrease of the power amplifier supply voltage, and decreases in response to an increase of the power amplifier supply voltage.

In several embodiments, the field-effect transistor is a short channel metal oxide semiconductor transistor.

In some embodiments, the power amplifier further includes a choke inductor electrically connected between the power amplifier supply voltage and a drain of the field-effect transistor.

In various embodiments, the current mirror is a Wilson current mirror.

In several embodiments, the power amplifier further includes a buffer configured to buffer the internal voltage of the current mirror to generate a gate bias voltage of the field-effect transistor. According to a number of embodiments, the buffer includes a first depletion-mode transistor and a second depletion-mode transistor configured to provide buffering with a zero shift.

In some embodiments, the current mirror includes a first mirror transistor having a drain configured to output the internal voltage, a second mirror transistor, a third mirror transistor, and a fourth mirror transistor, the third mirror transistor and the first mirror transistor connected in series between the input of the current mirror and a ground voltage, and the fourth mirror transistor and the second mirror transistor connected in series between the output of the current mirror and the ground voltage. According to a number of embodiments, a gate of the first mirror transistor is connected to a gate of the second mirror transistor, and a gate of the third mirror transistor is connected to a gate of the fourth mirror transistor. In various embodiments, a drain of the second mirror transistor is connected to the gate of the second mirror transistor, and a drain of the third mirror transistor is connected to the gate of the third mirror transistor.

In several embodiments, the power amplifier further includes a current source configured to generate the reference current.

In some embodiments, the envelope tracker includes a DC-to-DC converter configured to output a plurality of regulated voltages, a modulator configured to generate a modulator output voltage at an output based on the plurality of regulated voltages and the envelope of the radio frequency signal, and a modulator output filter coupled between the output of the modulator and the power amplifier supply voltage.

In several embodiments, the envelope tracker includes a DC-to-DC converter and an error amplifier configured to operate in parallel with one another to generate the power amplifier supply voltage.

In certain embodiments, the present disclosure relates to a method of radio frequency signal amplification in a mobile device. The method includes generating a power amplifier supply voltage that changes in relation to an envelope of a radio frequency signal using an envelope tracker, powering a power amplifier using the power amplifier supply voltage, amplifying the radio frequency signal using a field-effect transistor of the power amplifier, and generating a gate bias voltage of the field-effect transistor using an internal voltage of a current mirror of the power amplifier, including providing a reference current to an input of the current mirror and providing the power amplifier supply voltage to an output of the current mirror.

In various embodiments, the method includes increasing the internal voltage of the current mirror in response to a decrease of the power amplifier supply voltage, and decreasing the internal voltage of the current mirror in response to an increase of the power amplifier supply voltage.

In several embodiments, the field-effect transistor is a short channel metal oxide semiconductor transistor.

In a number of embodiments, the method further includes providing the power amplifier supply voltage to a drain of the field-effect transistor using a choke inductor.

In some embodiments, the current mirror is a Wilson current mirror.

In various embodiments, the method further incudes buffering the internal voltage of the current mirror to generate the gate bias voltage of the field-effect transistor.

In a number of embodiments, the method further includes generating the reference current using a current source.

In several embodiments, generating the power amplifier supply voltage includes outputting a plurality of regulated voltages from a DC-to-DC converter, generating a modulator output voltage based on the plurality of regulated voltages and the envelope of the radio frequency signal using a modulator, and filtering the modulator output voltage to generate the power amplifier supply voltage using a modulator output filter.

In some embodiments, generating the power amplifier supply voltage includes tracking the envelope using a DC-to-DC converter and an error amplifier operating in parallel.

DETAILED DESCRIPTION OF EMBODIMENTS

Figure 1:
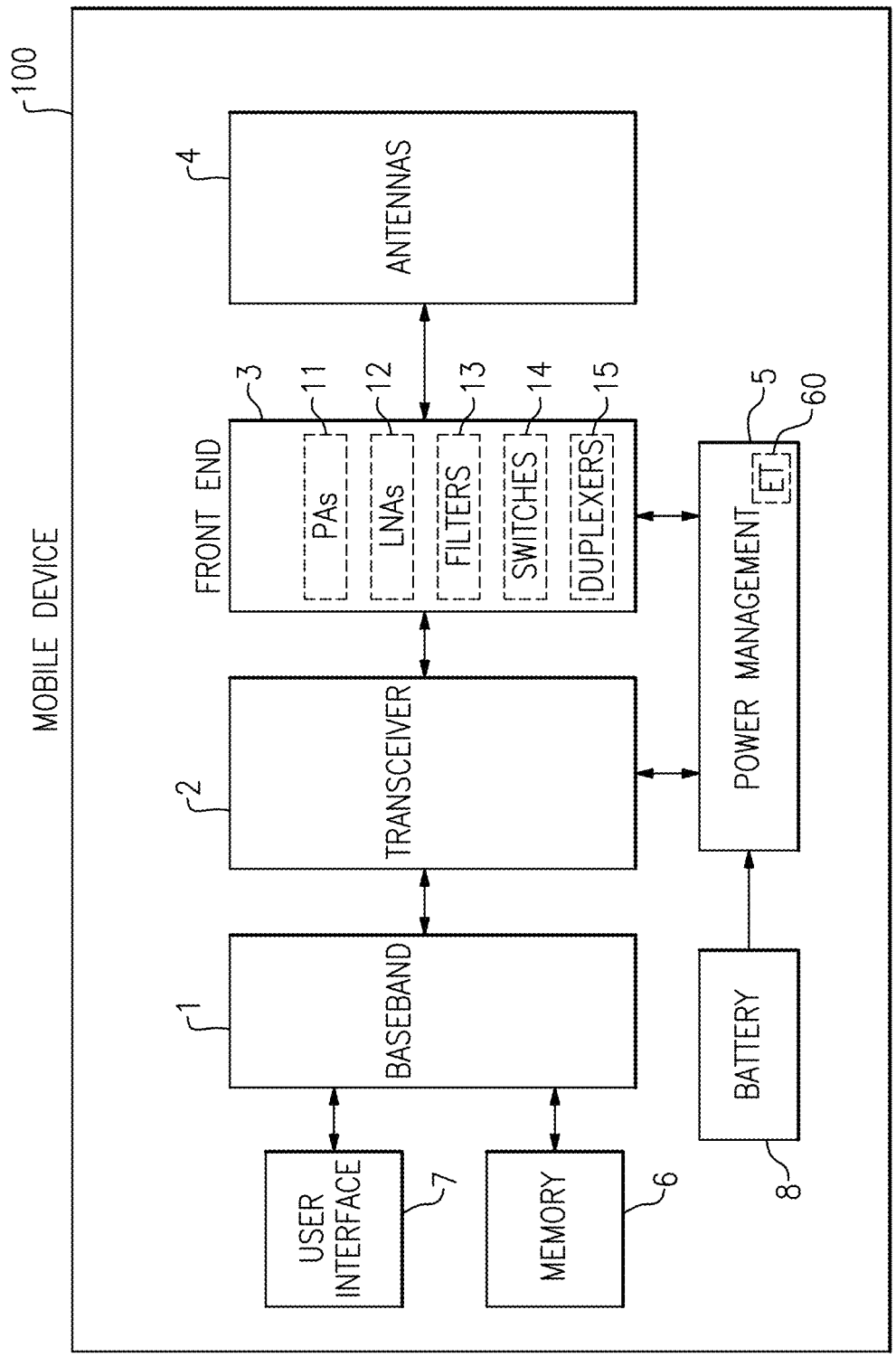
FIG. 1 is a schematic diagram of one embodiment of a mobile device.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1 is a schematic diagram of one example of a mobile device 100. The mobile device 100 includes a baseband system 1, a transceiver 2, a front end system 3, antennas 4, a power management system 5, a memory 6, a user interface 7, and a battery 8.

The mobile device 100 can be used communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBee), WMAN (for instance, WiMax), and/or GPS technologies.

The transceiver 2 generates RF signals for transmission and processes incoming RF signals received from the antennas 4. It will be understood that various functionalities associated with the transmission and receiving of RF signals can be achieved by one or more components that are collectively represented in FIG. 1 as the transceiver 2. In one example, separate components (for instance, separate circuits or dies) can be provided for handling certain types of RF signals.

The front end system 3 aids in conditioning signals transmitted to and/or received from the antennas 4. In the illustrated embodiment, the front end system 3 includes power amplifiers (PAs) 11, low noise amplifiers (LNAs) 12, filters 13, switches 14, and duplexers 15. However, other implementations are possible.

For example, the front end system 3 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 100 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band and/or in different bands.

The antennas 4 can include antennas used for a wide variety of types of communications. For example, the antennas 4 can include antennas associated transmitting and/or receiving signals associated with a wide variety of frequencies and communications standards.

In certain implementations, the antennas 4 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 100 can operate with beamforming in certain implementations. For example, the front end system 3 can include phase shifters having variable phase controlled by the transceiver 2. Additionally, the phase shifters are controlled to provide beam formation and directivity for transmission and/or reception of signals using the antennas 4. For example, in the context of signal transmission, the phases of the transmit signals provided to the antennas 4 are controlled such that radiated signals from the antennas 4 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 4 from a particular direction. In certain implementations, the antennas 4 include one or more arrays of antenna elements to enhance beamforming.

The baseband system 1 is coupled to the user interface 7 to facilitate processing of various user input and output (I/O), such as voice and data. The baseband system 1 provides the transceiver 2 with digital representations of transmit signals, which the transceiver 2 processes to generate RF signals for transmission. The baseband system 1 also processes digital representations of received signals provided by the transceiver 2. As shown in FIG. 1, the baseband system 1 is coupled to the memory 6 of facilitate operation of the mobile device 100.

The memory 6 can be used for a wide variety of purposes, such as storing data and/or instructions to facilitate the operation of the mobile device 100 and/or to provide storage of user information.

The power management system 5 provides a number of power management functions of the mobile device 100. The power management system 5 of FIG. 1 includes an envelope tracker 60. As shown in FIG. 1, the power management system 5 receives a battery voltage from the battery 8. The battery 8 can be any suitable battery for use in the mobile device 100, including, for example, a lithium-ion battery.

The mobile device 100 of FIG. 1 illustrates one example of an RF communication system that can include power amplifier(s) implemented in accordance with one or more features of the present disclosure. However, the teachings herein are applicable to RF communication systems implemented in a wide variety of ways.

Figure 2:
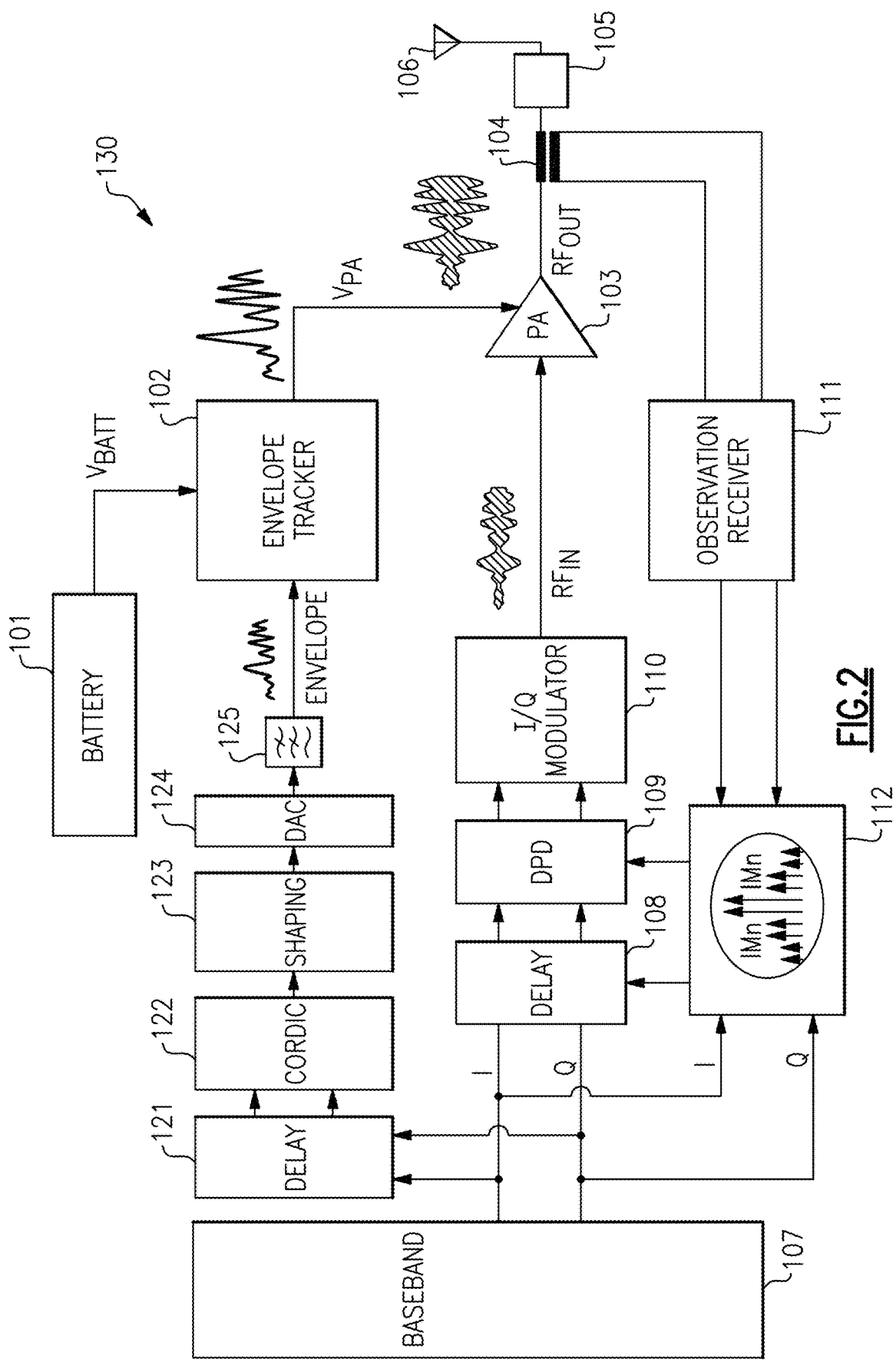
FIG. 2 is a schematic diagram of one embodiment of a transmit system for transmitting radio frequency (RF) signals from a mobile device.

FIG. 2 is a schematic diagram of one embodiment of a transmit system 130 for transmitting RF signals from a mobile device. The transmit system 130 includes a battery 101, an envelope tracker 102, a power amplifier 103, a directional coupler 104, a duplexing and switching circuit 105, an antenna 106, a baseband processor 107, a signal delay circuit 108, a digital pre-distortion (DPD) circuit 109, an I/Q modulator 110, an observation receiver 111, an intermodulation detection circuit 112, an envelope delay circuit 121, a coordinate rotation digital computation (CORDIC) circuit 122, a shaping circuit 123, a digital-to-analog converter 124, and a reconstruction filter 125.

The transmit system 130 of FIG. 2 illustrates one example of an RF communication system that can include power amplifier(s) implemented in accordance with one or more features of the present disclosure. However, the teachings herein are applicable to RF communication systems implemented in a wide variety of ways.

The baseband processor 107 operates to generate an I signal and a Q signal, which correspond to signal components of a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals are provided to the I/Q modulator 110 in a digital format. The baseband processor 107 can be any suitable processor configured to process a baseband signal. For instance, the baseband processor 107 can include a digital signal processor, a microprocessor, a programmable core, or any combination thereof.

The signal delay circuit 108 provides adjustable delay to the I and Q signals to aid in controlling relative alignment between the envelope signal and the RF signal $RF_{IN}$. The amount of delay provided by the signal delay circuit 108 is controlled based on amount of intermodulation detected by the intermodulation detection circuit 112.

The DPD circuit 109 operates to provide digital shaping to the delayed I and Q signals from the signal delay circuit 108 to generate digitally pre-distorted I and Q signals. In the illustrated embodiment, the DPD provided by the DPD circuit 109 is controlled based on amount of intermodulation detected by the intermodulation detection circuit 112. The DPD circuit 109 serves to reduce a distortion of the power amplifier 103 and/or to increase the efficiency of the power amplifier 103.

The I/Q modulator 110 receives the digitally pre-distorted I and Q signals, which are processed to generate an RF signal $RF_{IN}$. For example, the I/Q modulator 110 can include DACs configured to convert the digitally pre-distorted I and Q signals into an analog format, mixers for upconverting the analog I and Q signals to radio frequency, and a signal combiner for combining the upconverted I and Q signals into an RF signal suitable for amplification by the power amplifier 103. In certain implementations, the I/Q modulator 110 can include one or more filters configured to filter frequency content of signals processed therein.

The envelope delay circuit 121 delays the I and Q signals from the baseband processor 107. Additionally, the CORDIC circuit 122 processes the delayed I and Q signals to generate a digital envelope signal representing an envelope of the RF signal $RF_{IN}$. Although FIG. 2 illustrates an implementation using the CORDIC circuit 122, an envelope signal can be obtained in other ways.

The shaping circuit 123 operates to shape the digital envelope signal to enhance the performance of the transmit system 130. In certain implementations, the shaping circuit 123 includes a shaping table that maps each level of the digital envelope signal to a corresponding shaped envelope signal level. Envelope shaping can aid in controlling linearity, distortion, and/or efficiency of the power amplifier 103.

In the illustrated embodiment, the shaped envelope signal is a digital signal that is converted by the DAC 124 to an analog envelope signal. Additionally, the analog envelope signal is filtered by the reconstruction filter 125 to generate an envelope signal suitable for use by the envelope tracker 102. In certain implementations, the reconstruction filter 125 includes a low pass filter.

With continuing reference to FIG. 2, the envelope tracker 102 receives the envelope signal from the reconstruction filter 125 and a battery voltage $V_{BATT}$ from the battery 101, and uses the envelope signal to generate a power amplifier supply voltage $V_{PA}$ for the power amplifier 103 that changes in relation to the envelope of the RF signal $RF_{IN}$. The power amplifier 103 receives the RF signal $RF_{IN}$ from the I/Q modulator 110, and provides an amplified RF signal $RF_{OUT}$ to the antenna 106 through the duplexing and switching circuit 105, in this example.

The directional coupler 104 is positioned between the output of the power amplifier 103 and the input of the duplexing and switching circuit 105, thereby allowing a measurement of output power of the power amplifier 103 that does not include insertion loss of the duplexing and switching circuit 105. The sensed output signal from the directional coupler 104 is provided to the observation receiver 111, which can include mixers for down converting I and Q signal components of the sensed output signal, and DACs for generating I and Q observation signals from the downconverted signals.

The intermodulation detection circuit 112 determines an intermodulation product between the I and Q observation signals and the I and Q signals from the baseband processor 107. Additionally, the intermodulation detection circuit 112 controls the DPD provided by the DPD circuit 109 and/or a delay of the signal delay circuit 108 to control relative alignment between the envelope signal and the RF signal $RF_{IN}$.

By including a feedback path from the output of the power amplifier 103 and baseband, the I and Q signals can be dynamically adjusted to optimize the operation of the transmit system 130. For example, configuring the transmit system 130 in this manner can aid in providing power control, compensating for transmitter impairments, and/or in performing DPD.

Although illustrated as a single stage, the power amplifier 103 can include one or more stages. Furthermore, RF communication systems such as mobile devices can include multiple power amplifiers. In such implementations, separate envelope trackers can be provided for different power amplifiers and/or one or more shared envelope trackers can be used.

Adaptive Bias for Power Amplifiers operating with Envelope Tracking

Envelope tracking is a technique that can be used to increase power added efficiency (PAE) of a power amplifier by efficiently controlling a voltage level of a power amplifier supply voltage in relation to an envelope of the RF signal amplified by the power amplifier. Thus, when the envelope of the RF signal increases, the voltage supplied to the power amplifier can be increased. Likewise, when the envelope of the RF signal decreases, the voltage supplied to the power amplifier can be decreased to reduce power consumption.

In one example, an envelope tracker includes a DC-to-DC converter that operates in combination with an error amplifier to generate a power amplifier supply voltage based on an envelope signal. For example, the DC-to-DC converter and the error amplifier can be electrically connected in parallel with one another, and the DC-to-DC converter can track low frequency components of the envelope signal while the error amplifier can track high frequency components of the envelope signal. For example, the DC-to-DC converter's switching frequency can be reduced to be less than a maximum frequency component of the envelope signal, and the error amplifier can operate to smooth gaps in the converter's output to generate the power amplifier supply voltage. In certain implementations, the DC-to-DC converter and error amplifier are combined via a combiner.

In another example, an envelope tracker includes a multi-output boost switcher for generating regulated voltages of different voltage levels, a bank of switches for controlling selection of a suitable regulated voltage over time based on the envelope signal, and a filter for filtering the output of the switch bank to generate the power amplifier supply voltage.

Power amplifiers with adaptive bias for envelope tracking applications are provided herein. In certain embodiments, an envelope tracking system includes a power amplifier that amplifies an RF signal and that receives power from a power amplifier supply voltage, and an envelope tracker that generates the power amplifier supply voltage based on an envelope of the RF signal. The power amplifier includes a field-effect transistor (FET) for amplifying the RF signal, and a current mirror including an input that receives a reference current and an output connected to the power amplifier supply voltage. An internal voltage of the current mirror is used to bias the gate of the FET to compensate the FET for changes in the power amplifier supply voltage arising from envelope tracking.

By implementing the power amplifier with adaptive bias, non-idealities of the power amplifier's FET are compensated for. For example, such adaptive biasing aids in compensating for channel length modulation and/or drain induced barrier lowering that would otherwise give rise to high variation in RF gain versus power amplifier supply voltage.

In certain implementations, the FET is implemented as a short channel metal oxide semiconductor (MOS) transistor. Although short channel MOS transistors suffer from a number of transistor non-idealities, adaptive biasing provides compensation that enables the short channel MOS transistor to be used in the power amplifier without significantly degrading the power amplifier's performance. Since short channel MOS transistors can be fabricated in processes that are low cost and/or enable high degrees of integration, it is desirable to implement a power amplifier using a short channel MOS transistor in a number of applications.

In certain implementations, a buffer is further included for buffering the internal voltage of the current mirror to generate the gate bias voltage of the FET. Including the buffer can enhance the bandwidth and speed-up the transient response of the power amplifier's biasing, thereby improving amplitude and phase distortion.

The current mirror can be implemented in a wide variety of ways. In certain implementations, the current mirror is implemented as a Wilson current mirror. For example, the current mirror can be implemented using n-type field-effect transistors (NFETs) arranged as a four transistor Wilson current mirror. For example, the drain-to-source voltage of a first NFET of the four transistor Wilson mirror can increase as voltage of the output decreases, and is well-suited for increasing the power amplifier's gain as power amplifier supply voltage decreases.

Figure 3:
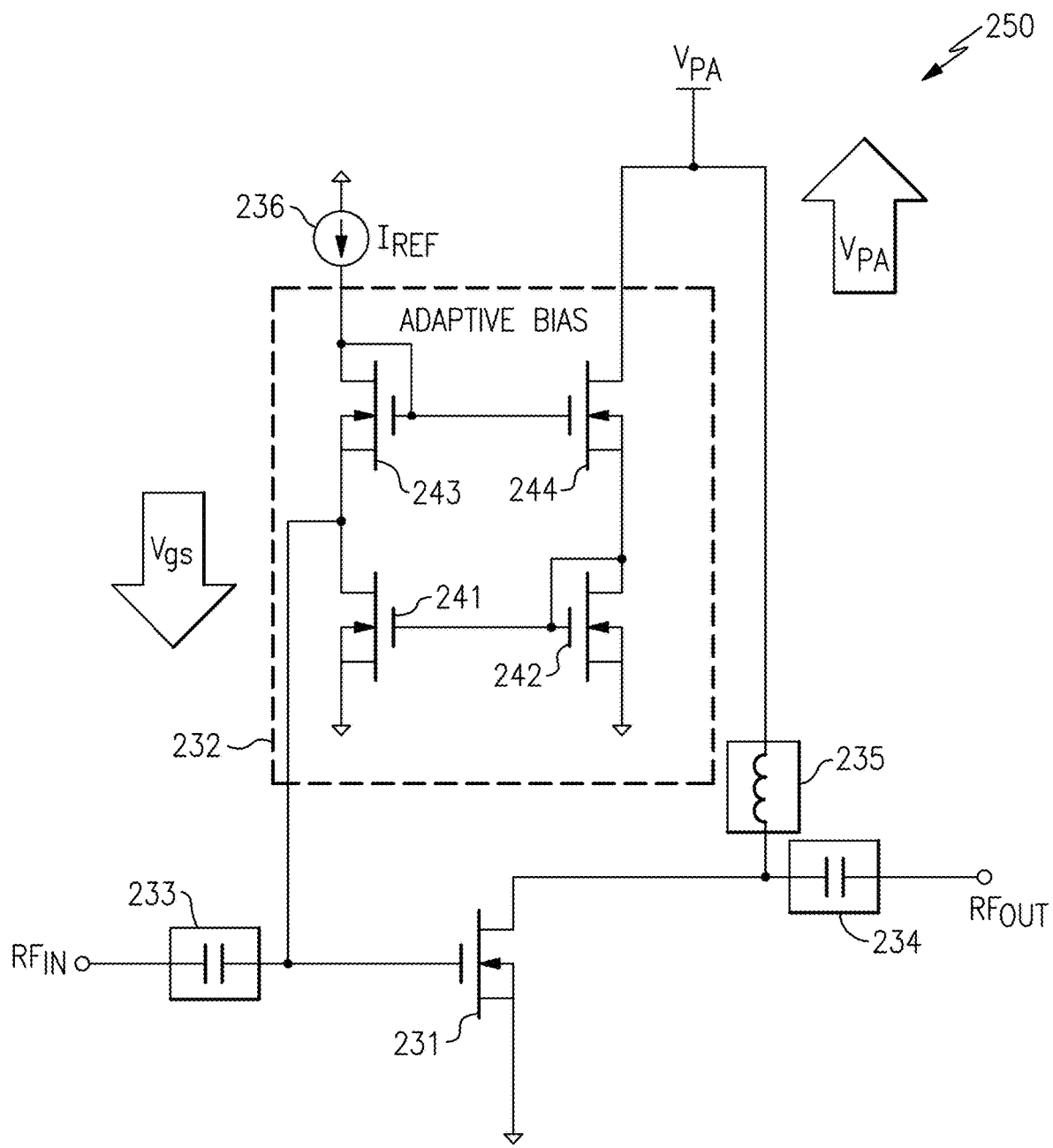
FIG. 3 is a schematic diagram of a power amplifier according to one embodiment.

FIG. 3 is a schematic diagram of a power amplifier 250 according to one embodiment. The power amplifier 250 includes an NFET 231, a Wilson current mirror 232, an input DC blocking capacitor 233, an output DC blocking capacitor 234, a choke inductor 235, and a reference current source 236.

Although FIG. 3 depicts one embodiment of a power amplifier with adaptive bias, the teachings herein are applicable to power amplifiers implemented in a wide variety of ways.

The power amplifier 250 receives an RF input signal $RF_{IN}$ at an RF input terminal, and provides an amplified RF output signal $RF_{OUT}$ to an RF output terminal. In the illustrated embodiment, the input DC blocking capacitor 233 is connected between the RF input terminal and the gate of the NFET 231 to allow biasing of the gate voltage of the NFET 231 separately from the DC voltage of the RF input terminal. Additionally, the output DC blocking capacitor 234 is connected between the drain of the NFET 231 and the RF output terminal to decouple the drain voltage of the NFET 231 from the DC voltage of the RF output terminal.

As shown in FIG. 3, the choke inductor 235 provides the power amplifier supply voltage $V_{PA}$ to the drain of the NFET 231. The power amplifier supply voltage $V_{PA}$ can be generated by an envelope tracker including, but not limited to, any of the envelope trackers disclosed herein.

The NFET 231 amplifies the RF input signal $RF_{IN}$ to generate the RF output signal $RF_{OUT}$. Additionally, the gate of the NFET 231 is biased by an internal voltage of the Wilson current mirror 232. Furthermore, the source of the NFET 231 receives a ground voltage (ground), while the drain of the NFET 231 receives the power amplifier supply voltage $V_{PA}$ from the choke inductor 235. In certain implementations, the NFET 231 is implemented as an n-type metal oxide semiconductor (NMOS) transistor. For example, the NFET 231 can be a short channel NMOS transistor.

The Wilson current mirror 232 includes an input that receives a reference current $I_{REF}$ from a reference current source 236, and an output connected to the power amplifier supply voltage $V_{PA}$. The Wilson current mirror 232 includes a first current mirror NFET 241, a second current mirror NFET 242, a third current mirror NFET 243, and a fourth current mirror NFET 244.

As shown in FIG. 3, the first current mirror NFET 241 and the second current mirror 242 each include a source connected to ground. Additionally, a gate of the first current mirror NFET 241 is connected to a gate and a drain of the second current mirror NFET 242 as well as to a source of the fourth current mirror NFET 244. Additionally, the output of the Wilson current mirror 232 is connected to the drain of the fourth current mirror NFET 244, while the input of the Wilson current mirror 232 is connected to a gate of the fourth current mirror NFET 244 and to a gate and a drain of the third current mirror NFET 243. Furthermore, the drain of the first current mirror NFET 241 and the drain of the third current mirror NFET 243 are connected to one another.

In the illustrated embodiment, an internal voltage of the Wilson current mirror 232 is provided to the gate of the NFET 231 to provide adaptive biasing. The internal voltage corresponds to the drain voltage of the first current mirror NFET 241, in this embodiment.

The Wilson current mirror 232 operates to mirror the reference current $I_{REF}$ received at the input to generate an output current provided at the output. As the power amplifier supply voltage $V_{PA}$ changes due to envelope tracking, the drain voltage of the first current mirror NFET 241 also changes such that the output current tracks the input current. The regulation of the Wilson current mirror 232 results in the drain-to-source voltage of the first current source NFET 241 increasing as the power amplifier supply voltage $V_{PA}$ decreases.

The drain voltage of the first current mirror NFET 241 is well-suited for increasing the power amplifier's gain as the power amplifier supply voltage $V_{PA}$ decreases, and for decreasing the power amplifier's gain as the power amplifier supply voltage $V_{PA}$ increases. Thus, the Wilson current mirror 232 provides adaptive biasing to the NFET 231 to compensate for gain variation arising from power supply variation. Such adaptive biasing is well-suited for compensating for short channel effects (for instance, channel length modulation and/or drain-induced barrier lowering) when the NFET 231 is implemented as a short channel NMOS transistor.

Figure 4B:
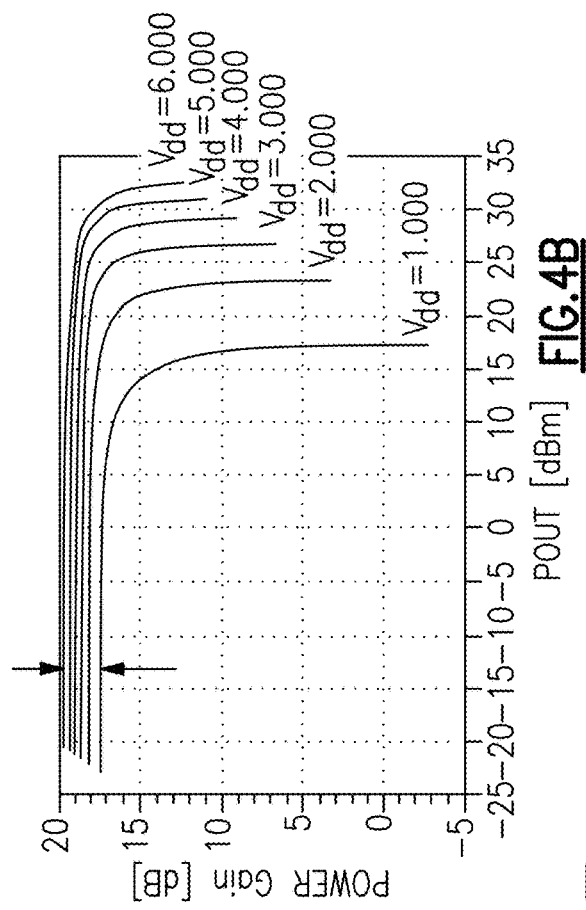
FIG. 4B is a graph of one example of power gain versus output power for a power amplifier with adaptive bias.
Figure 4D:
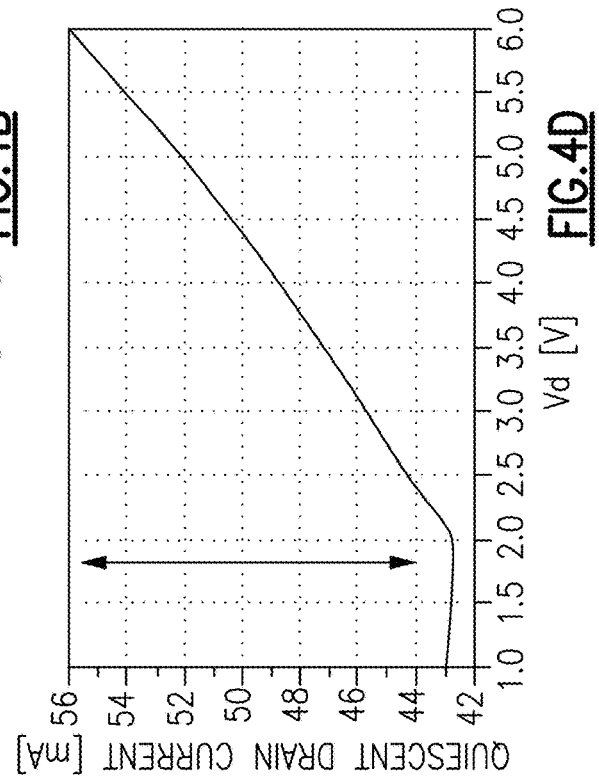
FIG. 4D is a graph of one example of quiescent drain current versus supply voltage for a power amplifier with adaptive bias.
Figure 4A:
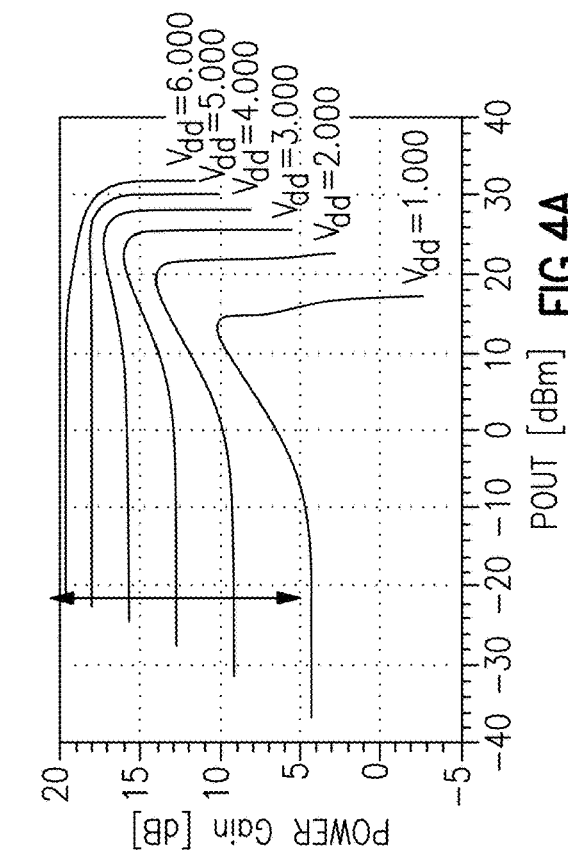
FIG. 4A is a graph of one example of power gain versus output power for a power amplifier without adaptive bias.

FIG. 4A is a graph of one example of power gain versus output power for a power amplifier without adaptive bias.

FIG. 4B is a graph of one example of power gain versus output power for a power amplifier with adaptive bias.

As shown by a comparison of FIG. 4A and FIG. 4B, adaptive biasing reduces variation in gain (for instance, from about 15 dB to about 3 dB, in this example).

Figure 4C:
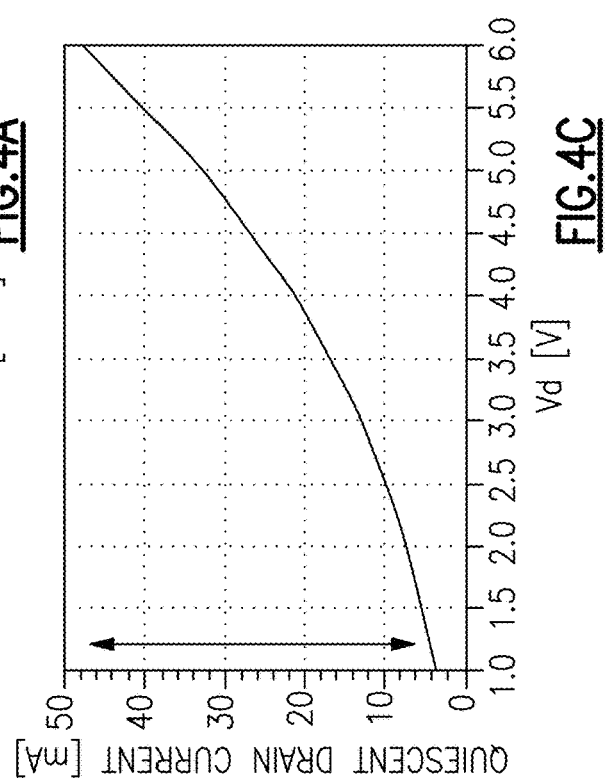
FIG. 4C is a graph of one example of quiescent drain current versus supply voltage for a power amplifier without adaptive bias.

FIG. 4C is a graph of one example of quiescent drain current versus supply voltage for a power amplifier without adaptive bias.

FIG. 4D is a graph of one example of quiescent drain current versus supply voltage for a power amplifier with adaptive bias.

As shown by a comparison of FIG. 4C and FIG. 4D, adaptive biasing reduces variation in quiescent drain current (for instance, from about 12× to about 1.25×, in this example).

Figure 5:
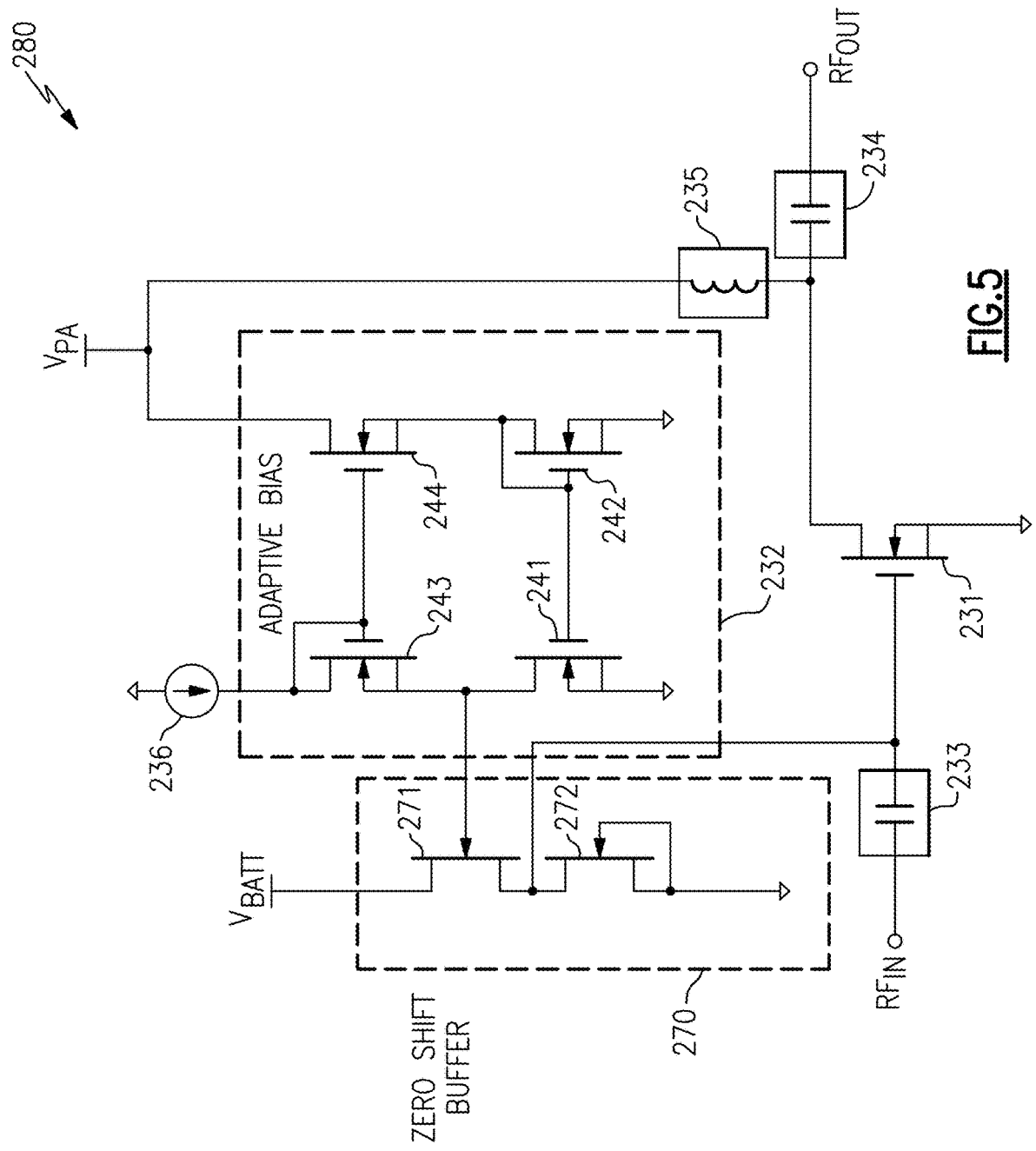
FIG. 5 is a schematic diagram of a power amplifier according to another embodiment.

FIG. 5 is a schematic diagram of a power amplifier 280 according to another embodiment. The power amplifier 280 includes an NFET 231, a Wilson current mirror 232, an input DC blocking capacitor 233, an output DC blocking capacitor 234, a choke inductor 235, a reference current source 236, and a buffer 270.

The power amplifier 280 of FIG. 5 is similar to the power amplifier 250 of FIG. 3, except that the power amplifier 280 further includes the buffer 270 for buffering the drain voltage of the first current mirror NFET 241 to generate the gate bias voltage of the NFET 231.

In the illustrated embodiment, the buffer 270 is implemented as a zero shift buffer including a first depletion mode (d-mode) FET 271 and a second d-mode FET 272, which can be, for example, junction field-effect transistors (JFETs) or Schottky gate FETs. The drain of the first d-mode FET 271 receives a battery voltage $V_{BATT}$, while a gate of the first d-mode FET 271 receives the internal voltage of the Wilson current mirror 232. Additionally, the gate and source of the second d-mode FET 272 are connected to ground, while the drain of the second d-mode FET 272 is connected to a source of the first d-mode FET 271 at a node that outputs the gate bias voltage for biasing the power amplifier's NFET 231.

By including the buffer 270, enhanced bandwidth and improved transient response of the power amplifier's biasing circuitry is achieved.

Figure 6A:
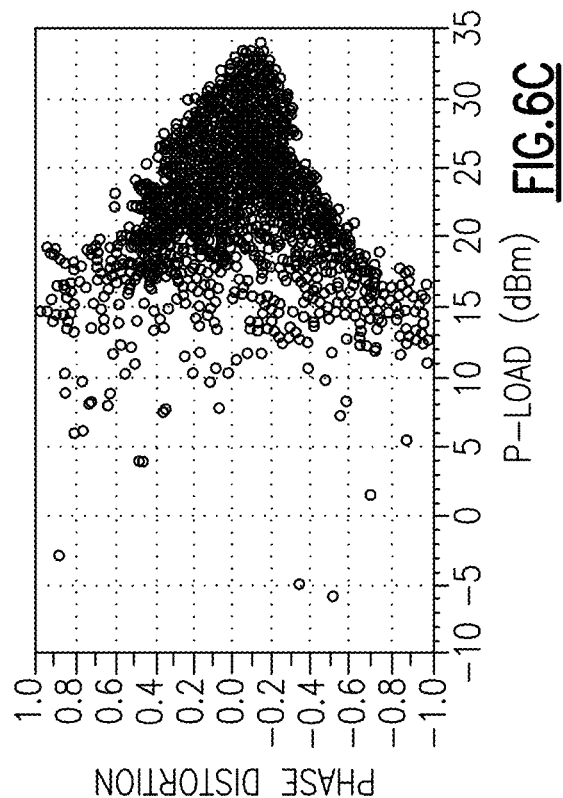
FIG. 6A is a graph of one example of amplitude distortion versus load power for a power amplifier with adaptive bias but without a buffer.

FIG. 6A is a graph of one example of amplitude distortion versus load power for a power amplifier with adaptive bias but without a buffer.

Figure 6C:
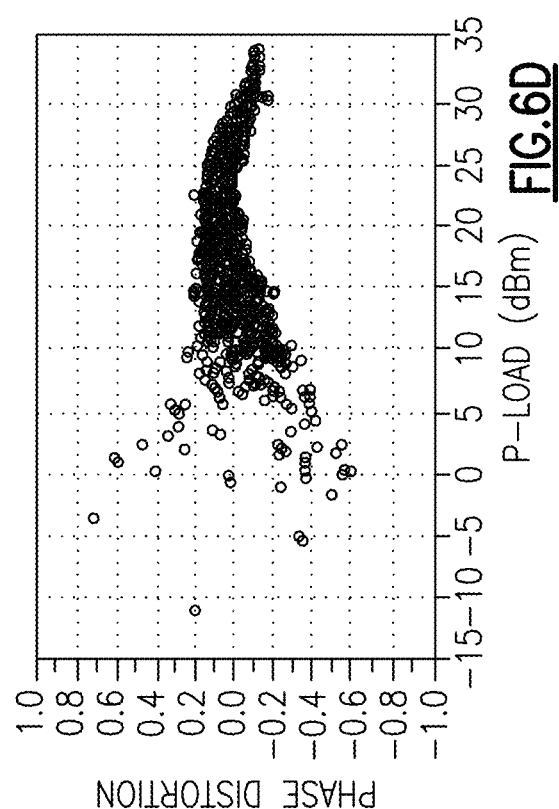
FIG. 6C is a graph of one example of phase distortion versus load power for a power amplifier with adaptive bias but without a buffer.
Figure 6B:
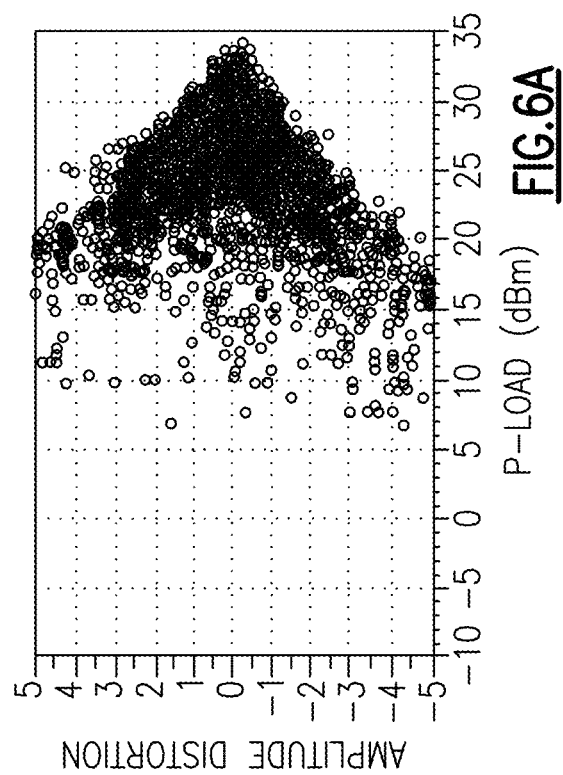
FIG. 6B is a graph of one example of amplitude distortion versus load power for a power amplifier with adaptive bias and with a buffer.

FIG. 6B is a graph of one example of amplitude distortion versus load power for a power amplifier with adaptive bias and with a buffer.

As shown by a comparison of FIG. 6A and FIG. 6B, using a buffer in combination with adaptive biasing reduces amplitude distortion (AM-to-AM).

FIG. 6C is a graph of one example of phase distortion versus load power for a power amplifier with adaptive bias but without a buffer.

Figure 6D:
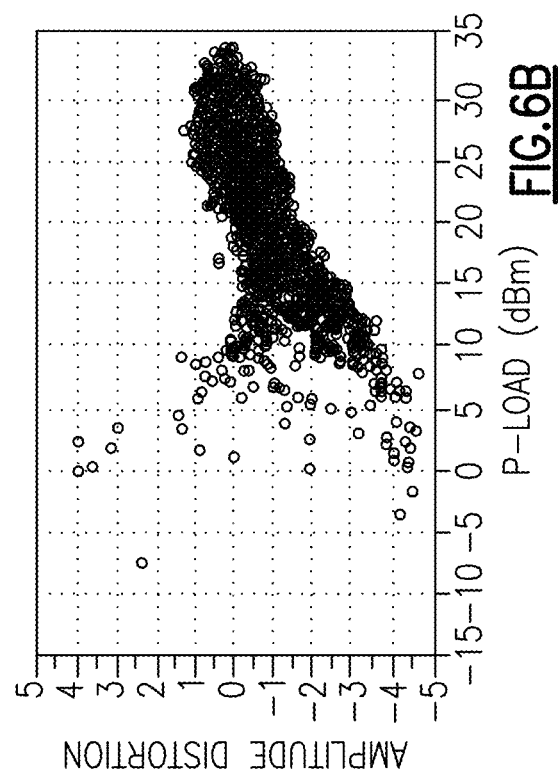
FIG. 6D is a graph of one example of phase distortion versus load power for a power amplifier with adaptive bias and with a buffer.

FIG. 6D is a graph of one example of phase distortion versus load power for a power amplifier with adaptive bias and with a buffer.

As shown by a comparison of FIG. 6C and FIG. 6D, using a buffer in combination with adaptive biasing reduces phase distortion (AM-to-PM).

Figure 7A:
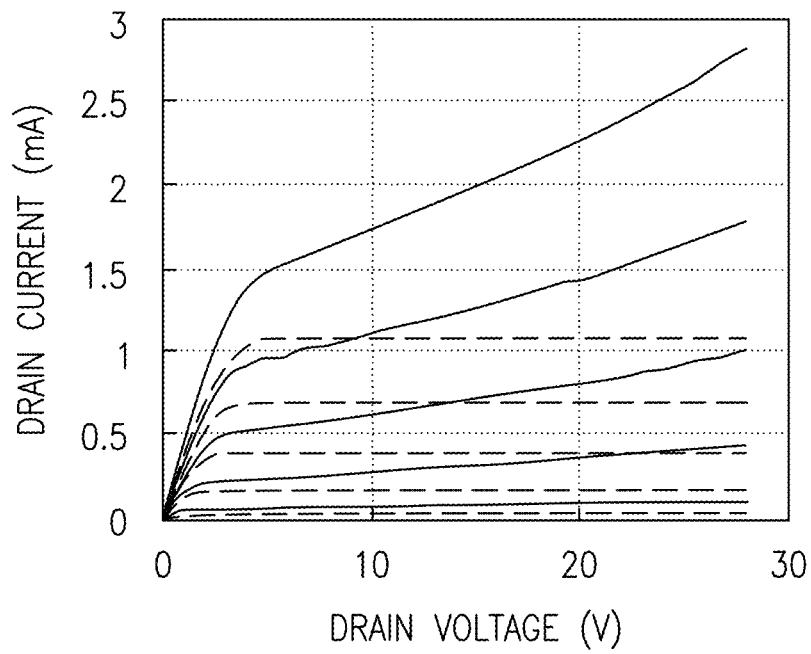
FIG. 7A is a graph of one example of drain current versus drain voltage for a short channel metal oxide semiconductor (MOS) transistor.

FIG. 7A is a graph of one example of drain current versus drain voltage for a short channel MOS transistor. Various plots are depicted of drain current versus drain voltage at different gate-to-source voltages of the short channel MOS transistor. Plots are included both without taking into account channel length modulation (dashed line plots) and with taking into account channel length modulation (solid line plots).

Figure 7B:
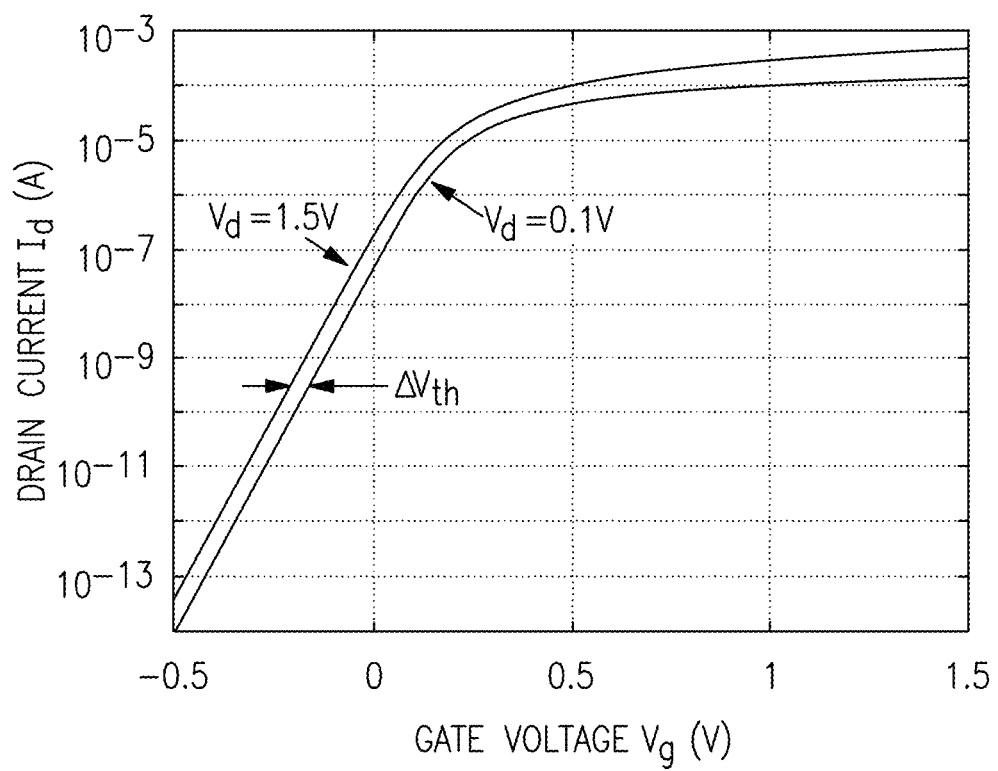
FIG. 7B is a graph of one example of drain current versus gate voltage for a short channel MOS transistor.

FIG. 7B is a graph of one example of drain current versus gate voltage for a short channel MOS transistor. The graph depicts one example of a shift in transistor threshold voltage arising from drain-induced barrier lowering.

Figure 8A:
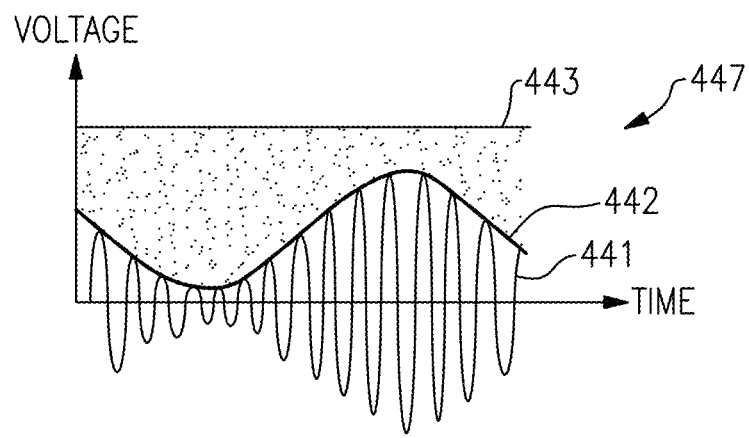
FIG. 8A is a graph of one example of a power amplifier supply voltage versus time.
Figure 8B:
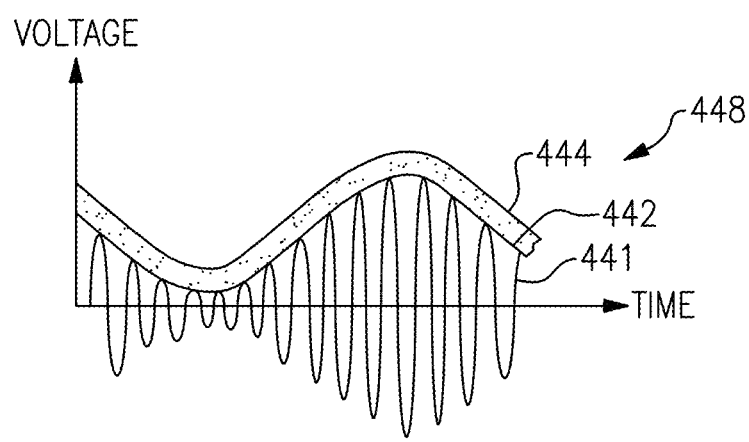
FIG. 8B is a graph of another example of a power amplifier supply voltage versus time.

FIGS. 8A-8B show two examples of power amplifier supply voltage versus time.

In FIG. 8A, a graph 447 illustrates one example of the voltage of an RF signal 441 and a power amplifier supply voltage 443 versus time. The RF signal 441 has an envelope 442.

It can be important that the power amplifier supply voltage 443 of a power amplifier has a voltage greater than that of the RF signal 441. For example, powering a power amplifier using a power amplifier supply voltage that has a magnitude less than that of the RF signal can clip the RF signal, thereby creating signal distortion and/or other problems. Thus, it can be important the power amplifier supply voltage 443 be greater than that of the envelope 442. However, it can be desirable to reduce a difference in voltage between the power amplifier supply voltage 443 and the envelope 442 of the RF signal 441, as the area between the power amplifier supply voltage 443 and the envelope 442 can represent lost energy, which can reduce battery life and increase heat generated in a wireless device.

In FIG. 8B, a graph 448 illustrates another example of the voltage of an RF signal 441 and a power amplifier supply voltage 444 versus time. In contrast to the power amplifier supply voltage 443 of FIG. 8A, the power amplifier supply voltage 444 of FIG. 8B changes in relation to the envelope 442 of the RF signal 441. The area between the power amplifier supply voltage 444 and the envelope 442 in FIG. 8B is less than the area between the power amplifier supply voltage 443 and the envelope 442 in FIG. 8A, and thus the graph 448 of FIG. 8B can be associated with a power amplifier having greater energy efficiency.

Figure 9A:
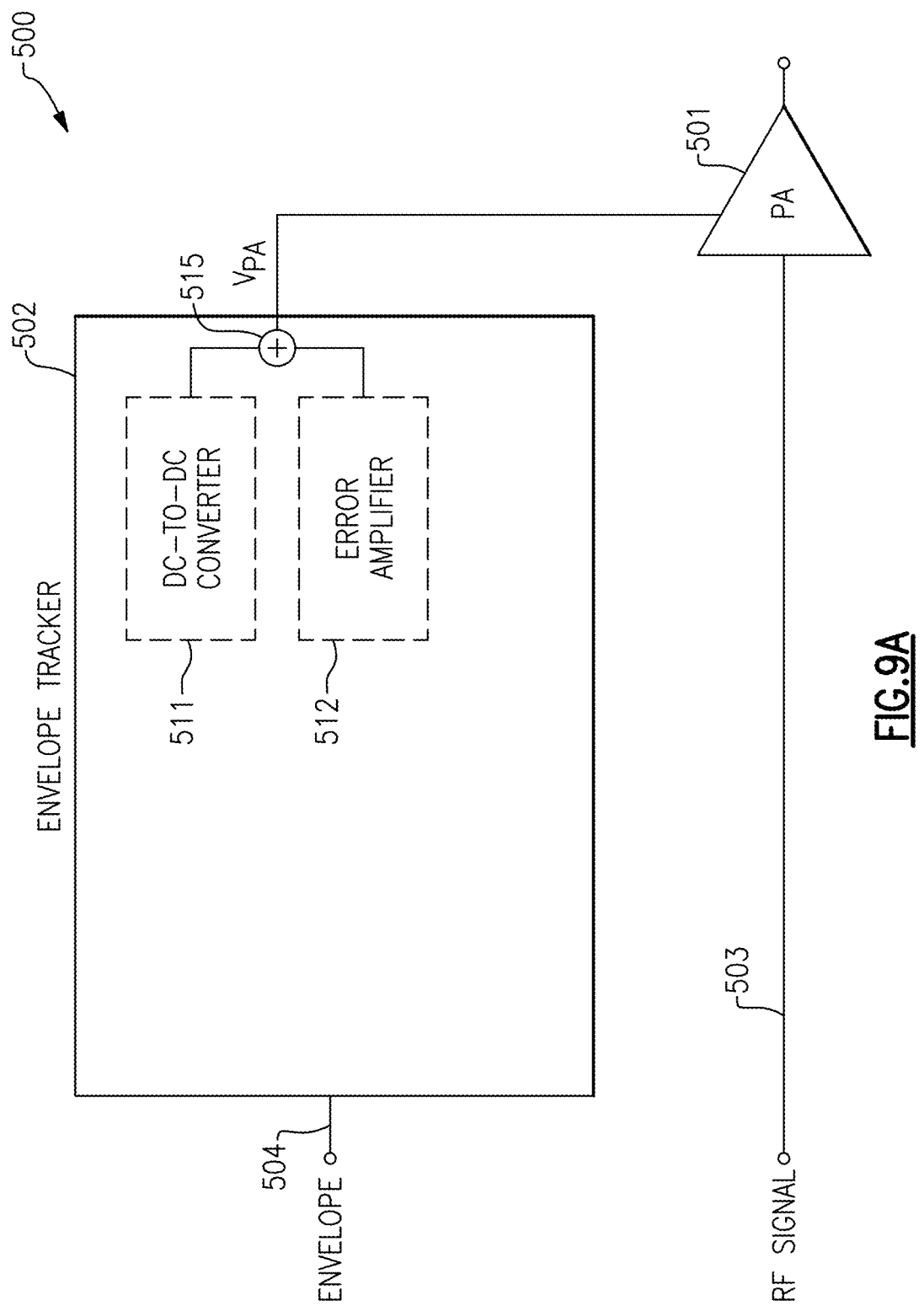
FIG. 9A is a schematic diagram of an envelope tracking system according to one embodiment.

FIG. 9A is a schematic diagram of an envelope tracking system 500 according to one embodiment. The envelope tracking system 500 includes a power amplifier 501 and an envelope tracker 502. The power amplifier 501 provides amplification to a radio frequency signal 503.

The envelope tracker 502 receives an envelope signal 504 corresponding to an envelope of the radio frequency signal 503. Additionally, the envelope tracker 502 generates a power amplifier supply voltage $V_{PA}$, which supplies power to the power amplifier 501.

The illustrated envelope tracker 502 includes a DC-to-DC converter 511 and an error amplifier 512 that operate in combination with one another to generate the power amplifier supply voltage $V_{PA}$ based on the envelope signal 504. In the illustrated embodiment, an output of the DC-to-DC converter 511 and an output of the error amplifier 512 are combined using a combiner 515.

The envelope tracker 502 of FIG. 9A illustrates one example of analog envelope tracking, in which a switching regulator operate in parallel with one another to track an envelope of an RF signal.

Figure 9B:
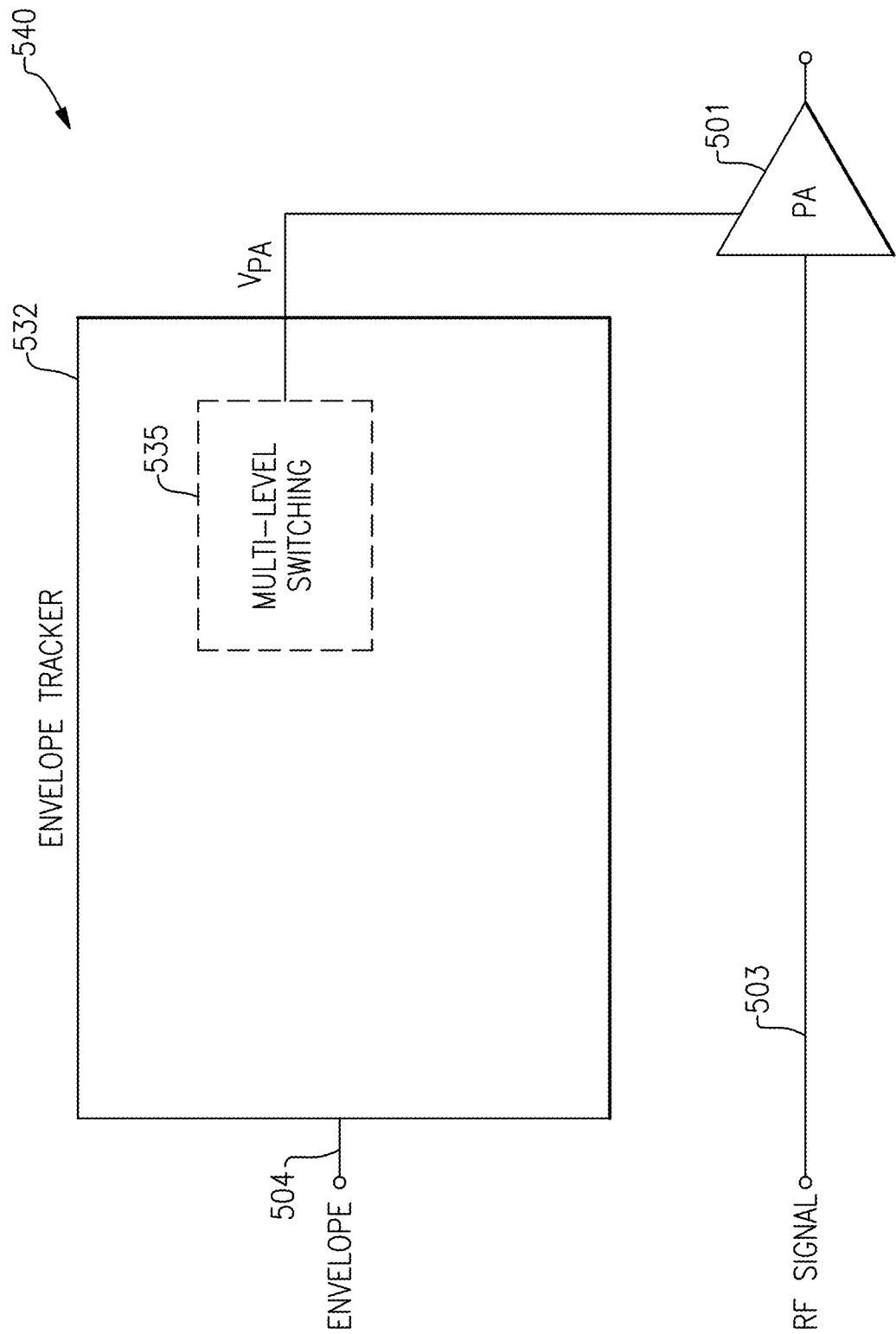
FIG. 9B is a schematic diagram of an envelope tracking system according to another embodiment.

FIG. 9B is a schematic diagram of an envelope tracking system 540 according to another embodiment. The envelope tracking system 540 includes a power amplifier 501 and an envelope tracker 532. The power amplifier 501 provides amplification to a radio frequency signal 503.

The envelope tracker 532 receives an envelope signal 504 corresponding to an envelope of the radio frequency signal 503. Additionally, the envelope tracker 532 generates a power amplifier supply voltage $V_{PA}$, which supplies power to the power amplifier 501.

The illustrated envelope tracker 532 includes a multi-level switching circuit 535. In certain implementations, the multi-level switching circuit includes a multi-output DC-to-DC converter for generating regulated voltages of different voltage levels, switches for controlling selection of a suitable regulated voltage over time based on the envelope signal, and a filter for filtering the output of the switches to generate the power amplifier supply voltage.

The envelope tracker 532 of FIG. 9B illustrates one example of MLS envelope tracking.

Figure 10:
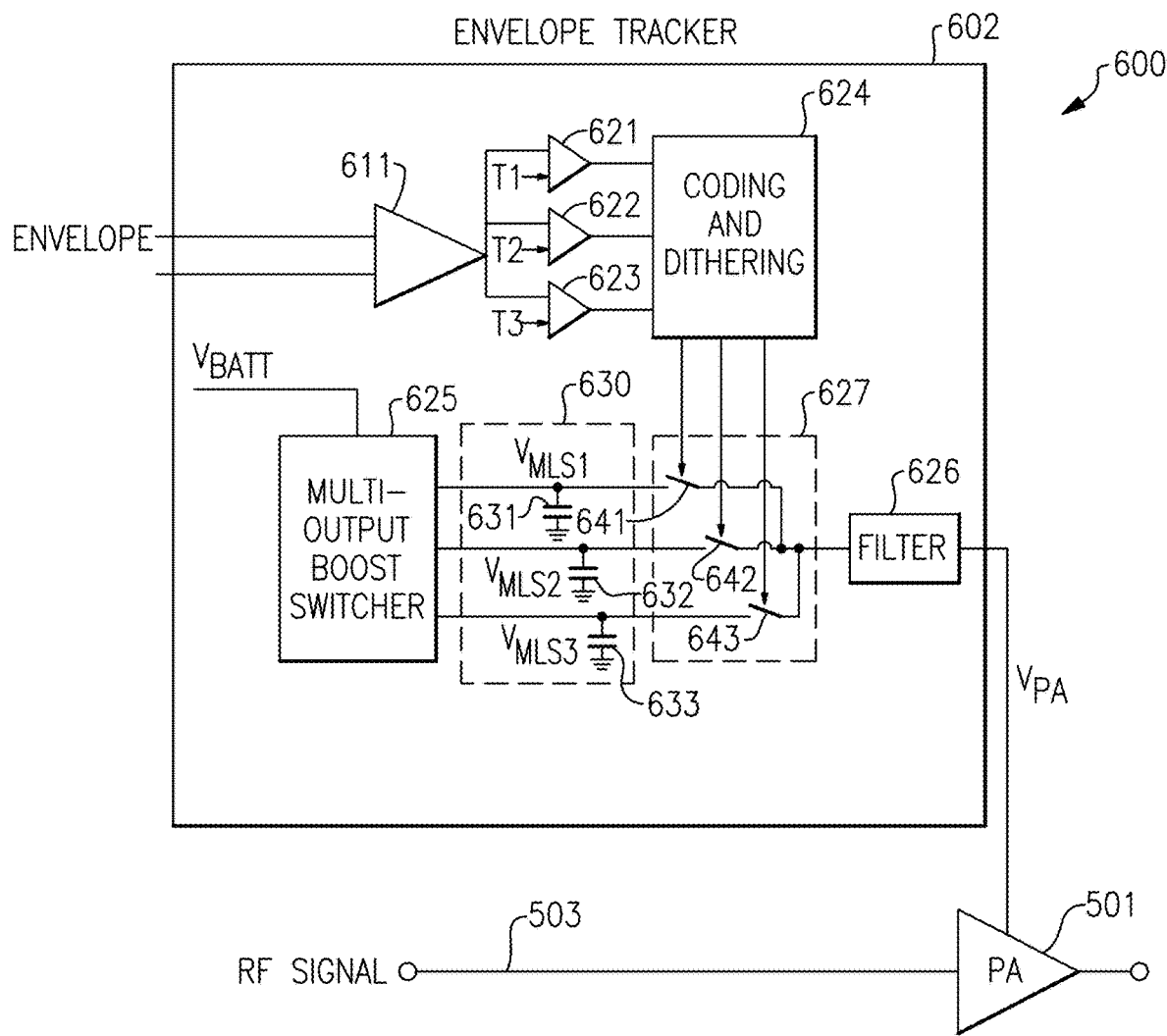
FIG. 10 is a schematic diagram of an envelope tracking system according to another embodiment.

FIG. 10 is a schematic diagram of an envelope tracking system 600 according to another embodiment. The envelope tracking system 600 includes a power amplifier 501 and an envelope tracker 602. The power amplifier 501 provides amplification to a radio frequency signal 503.

The envelope tracker 602 receives an envelope signal corresponding to an envelope of the radio frequency signal 503. In this example, the envelope signal is differential. Additionally, the envelope tracker 602 generates a power amplifier supply voltage $V_{PA}$, which supplies power to the power amplifier 501.

The illustrated envelope tracker 602 includes an envelope amplifier 611, a first comparator 621, a second comparator 622, a third comparator 623, a coding and dithering circuit 624, a multi-output boost switcher 625, a filter 626, a switch bank 627, and a capacitor bank 630. The capacitor bank 630 includes a first capacitor 631, a second capacitor 632, and a third capacitor 633. Additionally, the switch bank 627 includes a first switch 641, a second switch 642, and a third switch 643.

The envelope amplifier 611 amplifies the envelope signal to provide an amplified envelope signal to the first to third comparators 621-623. The first to third comparators 621-623 compare the amplified envelope signal to a first threshold T1, a second threshold T2, and a third threshold T3, respectively. The results of the comparisons are provided to the coding and dithering circuit 624, which processes the results to control selection of switches of the switch bank 627. The coding and dithering circuit 624 can activate the switches while using coding and/or dithering to reduce artifacts arising from opening and closing the switches.

Although an example with three comparators is shown, more or fewer comparators can be used. Furthermore, the coding and dithering circuit 624 can be omitted in favor of controlling the switch bank in other ways. In a first example, coding but not dithering is used. In a second example, dithering but not coding is used. In a third example, neither coding nor dithering is used.

The multi-output boost switcher 625 generates a first regulated voltage $V_{MLS1}$, a second regulated voltage $V_{MLS2}$, and a third regulated voltage $V_{MLS3}$ based on providing DC-to-DC conversion of a battery voltage $V_{BATT}$. Although an example with three regulated voltages is shown, the multi-output boost switcher 625 can generate more or fewer regulated voltages. In certain implementations, at least a portion of the regulated voltages are boosted relative to the battery voltage $V_{BATT}$. In some configurations, one or more of the regulated voltages is a buck voltage having a voltage lower than the battery voltage $V_{BATT}$.

The capacitor bank 630 aids in stabilizing the regulated voltages generated by the multi-output boost switcher 625. For example, the capacitors 631-633 operate as decoupling capacitors.

The filter 626 processes the output of the switch bank 627 to generate the power amplifier supply voltage $V_{PA}$. By controlling the selection of the switches 641-643 over time based on the envelope signal, the power amplifier supply voltage $V_{PA}$ is generated to track the envelope signal.

Figure 11A:
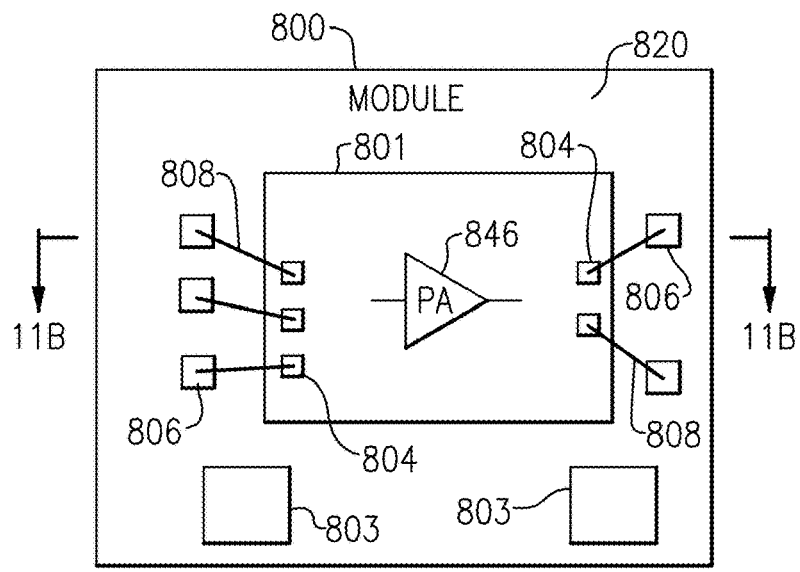
FIG. 11A is a schematic diagram of one embodiment of a packaged module.
Figure 11B:
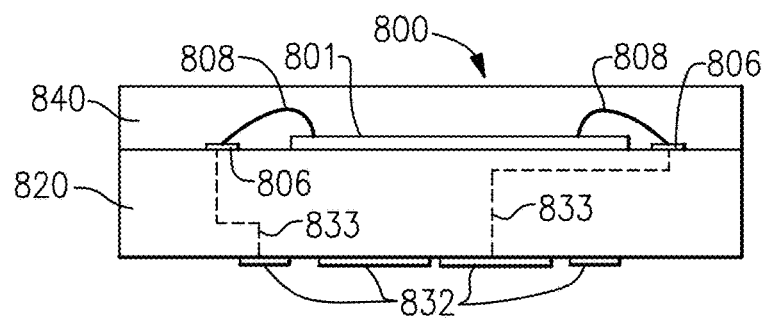
FIG. 11B is a schematic diagram of a cross-section of the packaged module of FIG. 11A taken along the lines 11B-11B.

FIG. 11A is a schematic diagram of one embodiment of a packaged module 800. FIG. 11B is a schematic diagram of a cross-section of the packaged module 800 of FIG. 11A taken along the lines 11B-11B.

The packaged module 800 includes an IC or die 801, surface mount components 803, wirebonds 808, a package substrate 820, and encapsulation structure 840. The package substrate 820 includes pads 806 formed from conductors disposed therein. Additionally, the die 801 includes pads 804, and the wirebonds 808 have been used to electrically connect the pads 804 of the die 801 to the pads 806 of the package substrate 820.

The die 801 includes a power amplifier 846, which can be implemented in accordance with any of the embodiments herein.

The package substrate 820 can be configured to receive a plurality of components such as the die 801 and the surface mount components 803, which can include, for example, surface mount capacitors and/or inductors.

As shown in FIG. 11B, the packaged module 800 is shown to include a plurality of contact pads 832 disposed on the side of the packaged module 800 opposite the side used to mount the die 801. Configuring the packaged module 800 in this manner can aid in connecting the packaged module 800 to a circuit board such as a phone board of a wireless device. The example contact pads 832 can be configured to provide RF signals, bias signals, power low voltage(s) and/or power high voltage(s) to the die 801 and/or the surface mount components 803. As shown in FIG. 11B, the electrically connections between the contact pads 832 and the die 801 can be facilitated by connections 833 through the package substrate 820. The connections 833 can represent electrical paths formed through the package substrate 820, such as connections associated with vias and conductors of a multilayer laminated package substrate.

In some embodiments, the packaged module 800 can also include one or more packaging structures to, for example, provide protection and/or facilitate handling of the packaged module 800. Such a packaging structure can include overmold or encapsulation structure 840 formed over the package substrate 820 and the components and die(s) disposed thereon.

It will be understood that although the packaged module 800 is described in the context of electrical connections based on wirebonds, one or more features of the present disclosure can also be implemented in other packaging configurations, including, for example, flip-chip configurations.

Figure 12:
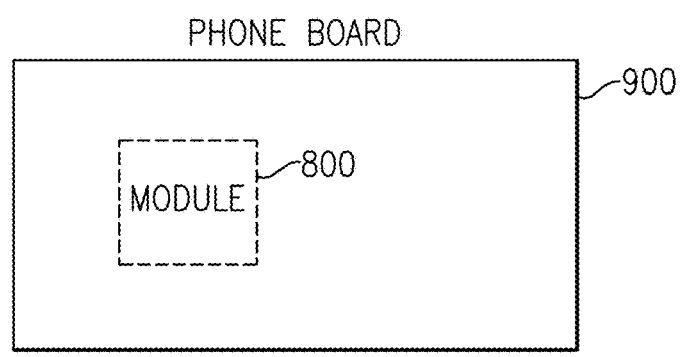
FIG. 12 is a schematic diagram of one embodiment of a phone board.

FIG. 12 is a schematic diagram of one embodiment of a phone board 900. The phone board 900 includes the module 800 shown in FIGS. 11A-11B attached thereto. Although not illustrated in FIG. 12 for clarity, the phone board 900 can include additional components and structures.

Applications

Some of the embodiments described above have provided examples in connection with wireless devices or mobile phones. However, the principles and advantages of the embodiments can be used for any other systems or apparatus that have needs for power amplifiers.

Such envelope trackers can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A mobile device comprising:
a transceiver configured to generate a radio frequency signal;
a power management system including an envelope tracker configured to generate a power amplifier supply voltage that changes in relation to an envelope of the radio frequency signal; and
a front end system including a power amplifier configured to amplify the radio frequency signal and to receive power from the power amplifier supply voltage, the power amplifier including a current mirror having an input configured to receive a reference current and an output electrically connected to the power amplifier supply voltage, and a field-effect transistor configured to amplify the radio frequency signal and having a gate biased based on an internal voltage of the current mirror, the internal voltage of the current mirror operable to increase in response to a decrease of the power amplifier supply voltage, and to decrease in response to an increase of the power amplifier supply voltage.

2. The mobile device of claim 1 wherein the field-effect transistor is a short channel metal oxide semiconductor transistor.

3. The mobile device of claim 1 wherein the power amplifier further includes a choke inductor electrically connected between the power amplifier supply voltage and a drain of the field-effect transistor.

4. The mobile device of claim 1 wherein the current mirror is a Wilson current mirror.

5. The mobile device of claim 1 wherein the power amplifier further includes a buffer configured to buffer the internal voltage of the current mirror to generate a gate bias voltage of the field-effect transistor.

6. The mobile device of claim 1 wherein the current mirror includes a first mirror transistor having a drain configured to output the internal voltage, a second mirror transistor, a third mirror transistor, and a fourth mirror transistor, the third mirror transistor and the first mirror transistor connected in series between the input of the current mirror and a ground voltage, and the fourth mirror transistor and the second mirror transistor connected in series between the output of the current mirror and the ground voltage.

7. The mobile device of claim 6 wherein a gate of the first mirror transistor is connected to a gate of the second mirror transistor, and a gate of the third mirror transistor is connected to a gate of the fourth mirror transistor.

8. The mobile device of claim 7 wherein a drain of the second mirror transistor is connected to the gate of the second mirror transistor, and a drain of the third mirror transistor is connected to the gate of the third mirror transistor.

9. The mobile device of claim 1 wherein the power amplifier further includes a current source configured to generate the reference current.

10. A mobile device comprising:
a transceiver configured to generate a radio frequency signal;
a power management system including an envelope tracker configured to generate a power amplifier supply voltage that changes in relation to an envelope of the radio frequency signal; and
a front end system including a power amplifier configured to amplify the radio frequency signal and to receive power from the power amplifier supply voltage, the power amplifier including a current mirror having an input configured to receive a reference current and an output electrically connected to the power amplifier supply voltage, a field-effect transistor configured to amplify the radio frequency signal and having a gate biased based on an internal voltage of the current mirror, and a buffer configured to buffer the internal voltage of the current mirror to generate a gate bias voltage of the field-effect transistor, the buffer including a first depletion-mode transistor and a second depletion-mode transistor configured to provide buffering with a zero shift.

11. An envelope tracking system comprising:
an envelope tracker configured to generate a power amplifier supply voltage that changes in relation to an envelope of a radio frequency signal; and
a power amplifier configured to amplify the radio frequency signal and to receive power from the power amplifier supply voltage, the power amplifier including a current mirror having an input configured to receive a reference current and an output electrically connected to the power amplifier supply voltage, and a field-effect transistor configured to amplify the radio frequency signal and having a gate biased based on an internal voltage of the current mirror, the current mirror including a first mirror transistor having a drain configured to output the internal voltage, a second mirror transistor, a third mirror transistor, and a fourth mirror transistor, the third mirror transistor and the first mirror transistor connected in series between the input of the current mirror and a ground voltage, and the fourth mirror transistor and the second mirror transistor connected in series between the output of the current mirror and the ground voltage.

12. The envelope tracking system of claim 11 wherein the internal voltage of the current mirror increases in response to a decrease of the power amplifier supply voltage, and decreases in response to an increase of the power amplifier supply voltage.

13. The envelope tracking system of claim 11 wherein the field-effect transistor is a short channel metal oxide semiconductor transistor.

14. The envelope tracking system of claim 2 wherein the current mirror is a Wilson current mirror.

15. The envelope tracking system of claim 11 wherein the power amplifier further includes a buffer configured to buffer the internal voltage of the current mirror to generate a gate bias voltage of the field-effect transistor.

16. The envelope tracking system of claim 11 wherein a gate of the first mirror transistor is connected to a gate of the second mirror transistor, and a gate of the third mirror transistor is connected to a gate of the fourth mirror transistor.

17. The envelope tracking system of claim 11 wherein a drain of the second mirror transistor is connected to the gate of the second mirror transistor, and a drain of the third mirror transistor is connected to the gate of the third mirror transistor.

18. A method of radio frequency signal amplification in a mobile device, the method comprising:
generating a power amplifier supply voltage that changes in relation to an envelope of a radio frequency signal using an envelope tracker;
powering a power amplifier using the power amplifier supply voltage;
amplifying the radio frequency signal using a field-effect transistor of the power amplifier;
generating a gate bias voltage of the field-effect transistor using an internal voltage of a current mirror of the power amplifier, including providing a reference current to an input of the current mirror and providing the power amplifier supply voltage to an output of the current mirror; and
increasing the internal voltage of the current mirror in response to a decrease of the power amplifier supply voltage, and decreasing the internal voltage of the current mirror in response to an increase of the power amplifier supply voltage.

19. The method of claim 18 further comprising buffering the internal voltage of the current mirror to generate the gate bias voltage of the field-effect transistor.

20. The method of claim 19 wherein buffering the internal voltage comprises using a first depletion-mode transistor and a second depletion-mode transistor to provide buffering with a zero shift.

* * * * *

UNITED STATES PATENT AND TRADEMARK OFFICE
CERTIFICATE OF CORRECTION

| | |
|---|---|
| PATENT NO. | : 11,482,975 B2 |
| APPLICATION NO. | : 17/302953 |
| DATED | : October 25, 2022 |
| INVENTOR(S) | : Lyalin et al. |

It is certified that error appears in the above-identified patent and that said Letters Patent is hereby corrected as shown below:

In the Claims

In Column 18, Claim 14, Line 20, delete "2" and insert --11--.

In Column 18, Claim 18, Line 43, delete "afield-effect" and insert --a field-effect--.

Signed and Sealed this
Twenty-first Day of February, 2023

*Katherine Kelly Vidal*

Katherine Kelly Vidal
*Director of the United States Patent and Trademark Office*